(12) United States Patent
Na et al.

(10) Patent No.: US 12,737,091 B2
(45) Date of Patent: Sep. 15, 2026

(54) DIGITIZER, DISPLAY DEVICE INCLUDING THE SAME, AND ELECTRONIC APPARATUS COMPRISING THE DISPLAY DEVICE

(71) Applicant: Samsung Display Co., LTD., Yongin-si (KR)

(72) Inventors: Hyunjae Na, Yongin-si (KR); Youngjin Lee, Yongin-si (KR); Seokwon Jang, Yongin-si (KR); Sunhaeng Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 19/065,905

(22) Filed: Feb. 27, 2025

(65) Prior Publication Data

US 2025/0370579 A1 Dec. 4, 2025

(30) Foreign Application Priority Data

May 28, 2024 (KR) ........................ 10-2024-0069150

(51) Int. Cl.
*G06F 3/046* (2006.01)
*H10K 59/40* (2023.01)
*H10K 102/00* (2023.01)

(52) U.S. Cl.
CPC ............. *G06F 3/046* (2013.01); *H10K 59/40* (2023.02); *G06F 2203/04102* (2013.01); *H10K 2102/311* (2023.02)

(58) Field of Classification Search
CPC ........... G06F 3/046; G06F 2203/04102; G06F 1/1616; G06F 1/1652; G06F 3/04164;
(Continued)

(56) References Cited

U.S. PATENT DOCUMENTS

2022/0091689 A1* 3/2022 Kishimoto .............. G06F 3/046
2022/0100234 A1* 3/2022 Kishimoto ............ G06F 3/0446
(Continued)

FOREIGN PATENT DOCUMENTS

KR 10-2023-0113438 7/2023

OTHER PUBLICATIONS

Extended European Search Report dated Aug. 20, 2025 issued in corresponding EP Application No. 25166874.5, 10 pages.

*Primary Examiner* — Xuemei Zheng
(74) *Attorney, Agent, or Firm* — Womble Bond Dickinson (US) LLP

(57) ABSTRACT

A digitizer includes: a first base layer including a first non-folding area, a folding area contacting the first non-folding area, and a second non-folding area contacting the folding area, the first base layer defining a first opening in the folding area, a second opening on one side of the first opening in a first direction, and a first via hole between the first opening and the second opening in plan view; a first loop group including a plurality of loops having a long side extending in the first direction; and a second loop group including a plurality of loops having a long side extending in a second direction crossing the first direction. Some of the plurality of loops included in the first loop group may extend from a lower part of the first base layer to an upper part of the first base layer through the first via hole.

19 Claims, 16 Drawing Sheets

(58) Field of Classification Search
CPC . H10K 59/40; H10K 77/111; H10K 2102/311
See application file for complete search history.

(56) References Cited

U.S. PATENT DOCUMENTS

| | | | | |
|---|---|---|---|---|
| 2023/0236629 | A1* | 7/2023 | Kishimoto | G06F 1/1652<br>361/679.02 |
| 2023/0289021 | A1* | 9/2023 | Jeon | G06F 3/046 |

* cited by examiner

Figure 4:
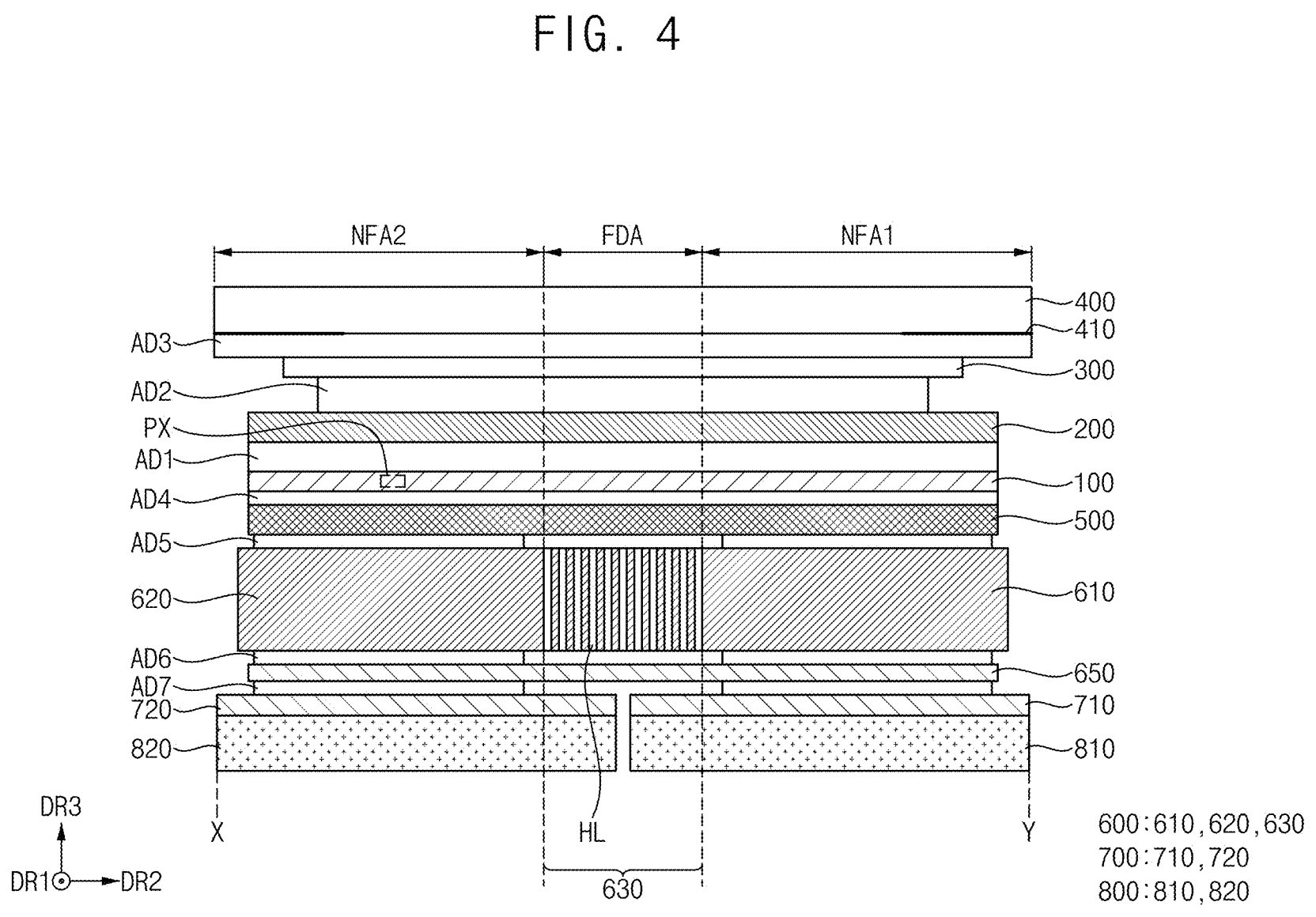

400
410
300
200
100
500
610
650
710
810
Y
NFA1
FDA
NFA2
630
HL
X
AD3
AD2
PX
AD1
AD4
AD5
620
AD6
AD7
720
820
DR3
DR2
DR1

600:610,620,630

F1
A
Y2_2
Y0_1
Y0_2
CNT8
CNT7
CNT6
CNT5
HL1
HL3
CNT4
C2n-1
C2n
CNT2
600a
CNT1
CNT3
Y4_1
Y1_2
Y4_2
HL2
Y2_1
Y2_2
X2_1
Y1_1
Y3_2
Y3_1
R1
R2
I
II
III
DR2
DR3
DR1
GHL1:HL1,HL2
GHL2:HL3

FIG. 12

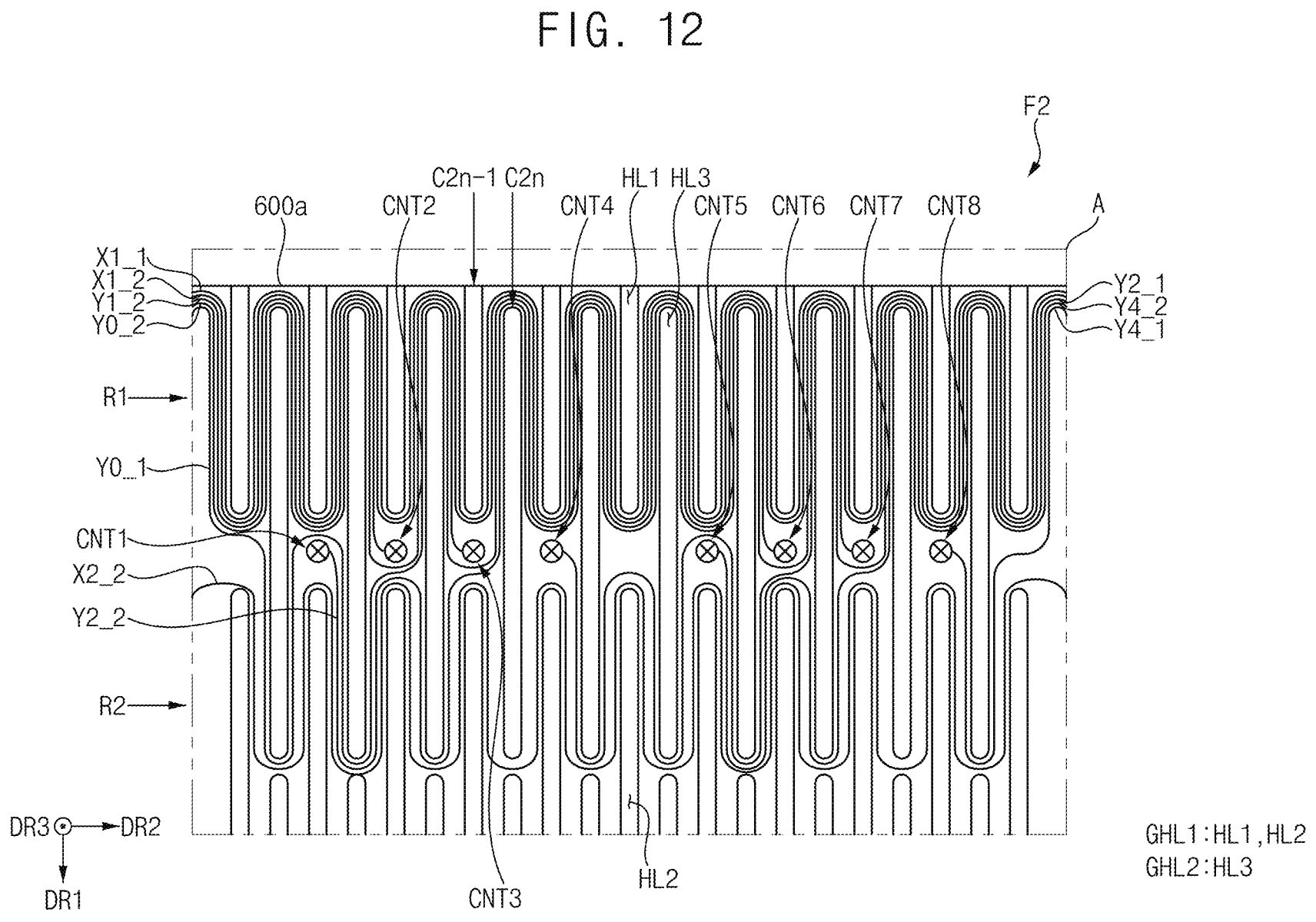

F2
A
Y2_1
Y4_2
Y4_1
GHL1:HL1,HL2
GHL2:HL3
CNT8
CNT7
CNT6
CNT5
HL1 HL3
HL2
CNT4
C2n-1 C2n
CNT3
CNT2
600a
X1_1
X1_2
Y1_2
Y0_2
R1
Y0_1
CNT1
X2_2
Y2_2
R2
DR2
DR3
DR1

DIGITIZER, DISPLAY DEVICE INCLUDING THE SAME, AND ELECTRONIC APPARATUS COMPRISING THE DISPLAY DEVICE

CROSS-REFERENCE TO RELATED APPLICATION

The present application claims priority to and benefit of Korean Patent Application No. 10-2024-0069150, filed on May 28, 2024, in the Korean Intellectual Property Office, the entire content of which is incorporated herein by reference.

BACKGROUND

1 Field

One or more embodiments of the present disclosure relate to a digitizer, a display device including the digitizer, and an electronic apparatus including the display device. For example, one or more embodiments of the present disclosure relate to a digitizer including a plurality of loops, a display device including the digitizer, and an electronic apparatus including the display device.

2 Description of the Related Art

A display device is a device that displays an image to provide visual information to a user. Recently, flexible display devices that enhance portability and/or space utilization by using materials with flexible characteristics while providing a wide display screen have gained significant attention. For example, bendable display devices that include a display panel that may be bent, rollable display devices that include a display panel that may be rolled, and foldable display devices that include a display panel that may be folded are being actively developed.

Additionally, some display devices may support touch input using an electronic pen (e.g., a stylus pen) as well as a touch input using a body part (e.g., a finger) of a user. These display devices may detect a touch input more precisely when using the electronic pen compared to using only the user's body part.

SUMMARY

One or more aspects of embodiments of the present disclosure are directed toward a digitizer with improved quality.

One or more aspects of embodiments of the present disclosure are directed toward a display device including the digitizer.

One or more aspects of embodiments of the present disclosure are directed toward an electronic apparatus including the display device.

Additional aspects will be set forth in part in the description which follows and, in part, will be apparent from the description, or may be learned by practice of the presented embodiments.

A digitizer according to one or more embodiments of the present disclosure may include a first base layer including a first non-folding area, a folding area contacting the first non-folding area, and a second non-folding area contacting the folding area, the first base layer defining a first opening in the folding area, a second opening on one side of the first opening in a first direction, and a first via hole (e.g., via opening or via) between the first opening and the second opening in plan view, a first loop group including a plurality of loops having a long side extending in the first direction, and a second loop group including a plurality of loops having a long side extending in a second direction crossing the first direction.

In one or more embodiments, at least some of the plurality of loops included in the first loop group may extend from a lower part of the first base layer to an upper part of the first base layer through the first via hole.

In one or more embodiments, at least some of the plurality of loops included in the first loop group may fill the first via hole.

In one or more embodiments, the first base layer may define a third opening on one side of the first opening and the second opening in the second direction.

In one or more embodiments, a first row in which the first opening and the third opening overlap in the second direction and a second row in which the second opening and the third opening overlap in the second direction may be defined in the folding area.

In one or more embodiments, at least some of the plurality of loops included in the first loop group may cross the folding area along the first row and the second row.

In one or more embodiments, the first opening may contact one end of the digitizer.

In one or more embodiments, at least some of the plurality of loops included in the first loop group may be arranged adjacent to one end of the digitizer.

In one or more embodiments, the plurality of loops included in the first loop group may cross at least a portion of the folding area.

In one or more embodiments, the digitizer may further include a second base layer on the first base layer and covering at least some of the plurality of loops included in the first loop group and at least some of the plurality of loops included in the second loop group.

In one or more embodiments, the second base layer may define a fourth opening overlapping the first opening in plan view.

In one or more embodiments, the digitizer may further include a third base layer arranged under the first base layer and covering at least some of the plurality of loops included in the first loop group and at least some of the plurality of loops included in the second loop group.

In one or more embodiments, the third base layer may define a fifth opening overlapping the first opening and the fourth opening in plan view.

In one or more embodiments, the first base layer may define a second via hole at least partially overlapping the first via hole in the second direction.

In one or more embodiments, at least some of the plurality of loops included in the first loop group may extend from a lower part of the first base layer to an upper part of the first base layer through the second via hole.

In one or more embodiments, the first loop group may include a second loop.

In one or more embodiments, at least a portion of a long side of the second loop may be arranged in the first non-folding area.

In one or more embodiments, at least a portion of a short side of the second loop may be arranged in the folding area.

In one or more embodiments, at least some of the plurality of loops included in the first loop group may be arranged below the first base layer and on the first base layer.

A display device according to one or more embodiments of the present disclosure may include a display panel and a digitizer arranged under the display panel.

In one or more embodiments, the digitizer may include a first base layer including a first non-folding area, a folding area contacting the first non-folding area, and a second non-folding area contacting the folding area, the base layer defining a first opening in the folding area, a second opening on one side of the first opening in a first direction, and a first via hole between the first opening and the second opening in plan view, a first loop group including a plurality of loops having a long side extending in the first direction, and a second loop group including a plurality of loops having a long side extending in a second direction crossing the first direction.

A digitizer according to one or more embodiments of the present disclosure may include a first base layer including a first non-folding area, a folding area contacting the first non-folding area, and a second non-folding area contacting the folding area, the base layer defining a first opening in the folding area, a second opening on one side of the first opening in a first direction, and a first via hole between the first opening and the second opening in plan view, a first loop group including a plurality of loops having a long side extending in the first direction, and a second loop group including a plurality of loops having a long side extending in a second direction crossing the first direction. In addition, at least some of the plurality of loops included in the first loop group may extend from a lower part of the first base layer to an upper part of the first base layer through the first via hole.

According to the present disclosure, interference between wirings may be prevented or reduced and a digitizer with improved reliability may be provided. In addition, sensing uniformity may be improved over an entire area of the digitizer, and occurrence of an unrecognized area in the digitizer may also be prevented or reduced.

Furthermore, a process of manufacturing the digitizer may be simplified.

BRIEF DESCRIPTION OF DRAWINGS

Illustrative, non-limiting embodiments will be more clearly understood from the following detailed description in conjunction with the accompanying drawings; however, they may be embodied in different forms and should not be construed as limited to example embodiments set forth herein. Rather, these embodiments are provided so that this disclosure will be thorough and complete, and will fully convey the scope of the example embodiments to those skilled in the art. The above and other aspects, features, and advantages of certain embodiments of the present disclosure will be more apparent from the following description taken in conjunction with the accompanying drawings.

FIG. 4 is a cross-sectional view of the display device of FIG. 3 taken along an X-Y line according to one or more embodiments of the disclosure.

FIG. 12 is an enlarged plan view illustrating loops in a second wiring layer in area A of FIG. 6 according to one or more embodiments of the disclosure.

DETAILED DESCRIPTION

Figure 1A:
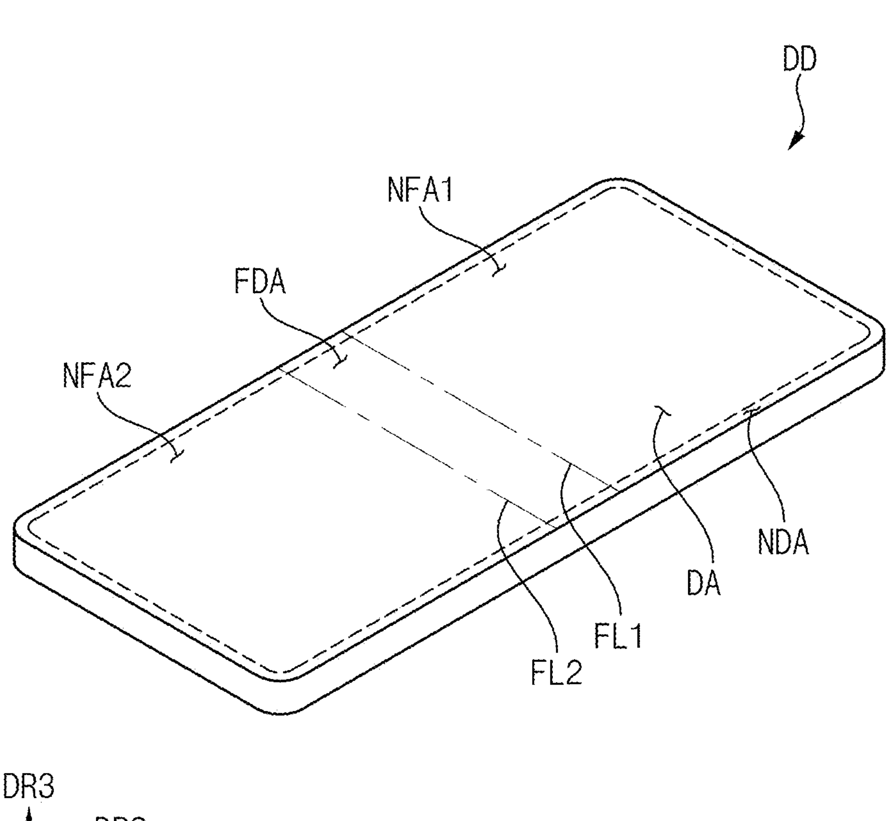
FIG. 1A is a perspective view illustrating an unfolded state of a display device according to one or more embodiments of the disclosure.

Hereinafter, display devices in accordance with embodiments of the present disclosure will be described in more detail with reference to the accompanying drawings. The same reference numerals are used for the same components in the drawings, and redundant descriptions of the same components will not be provided for conciseness.

Figure 1B:
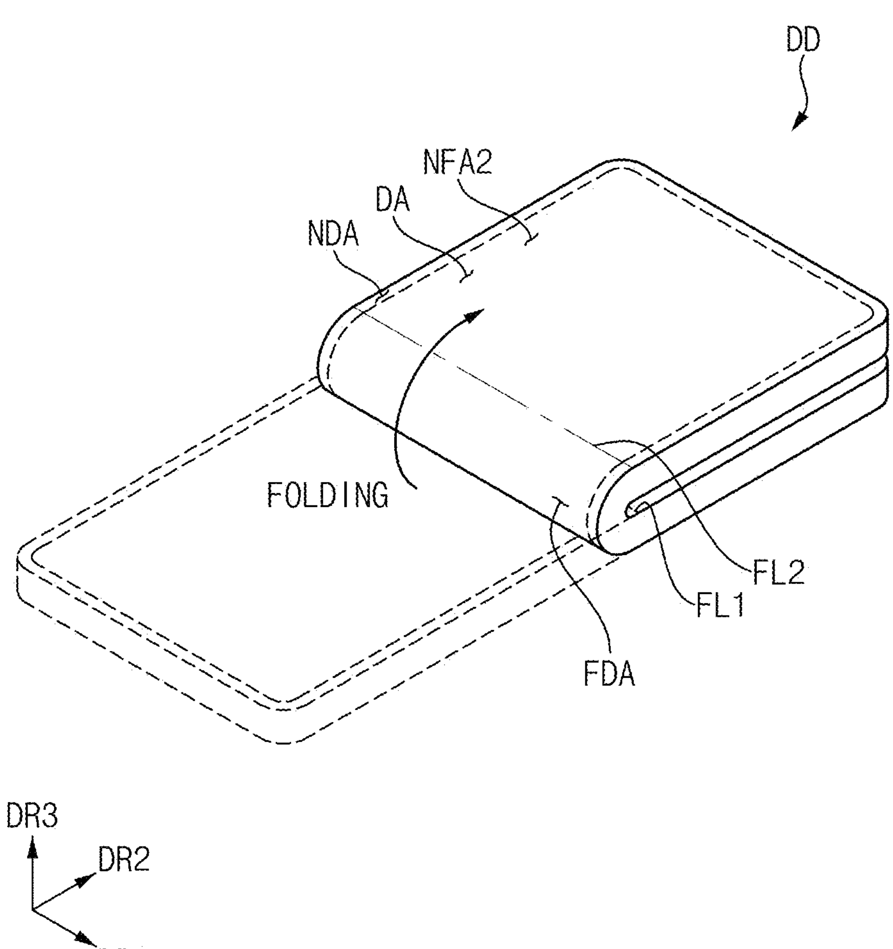
FIG. 1B is a perspective view illustrating a folded state of the display device of FIG. 1A according to one or more embodiments of the disclosure.
Figure 2A:
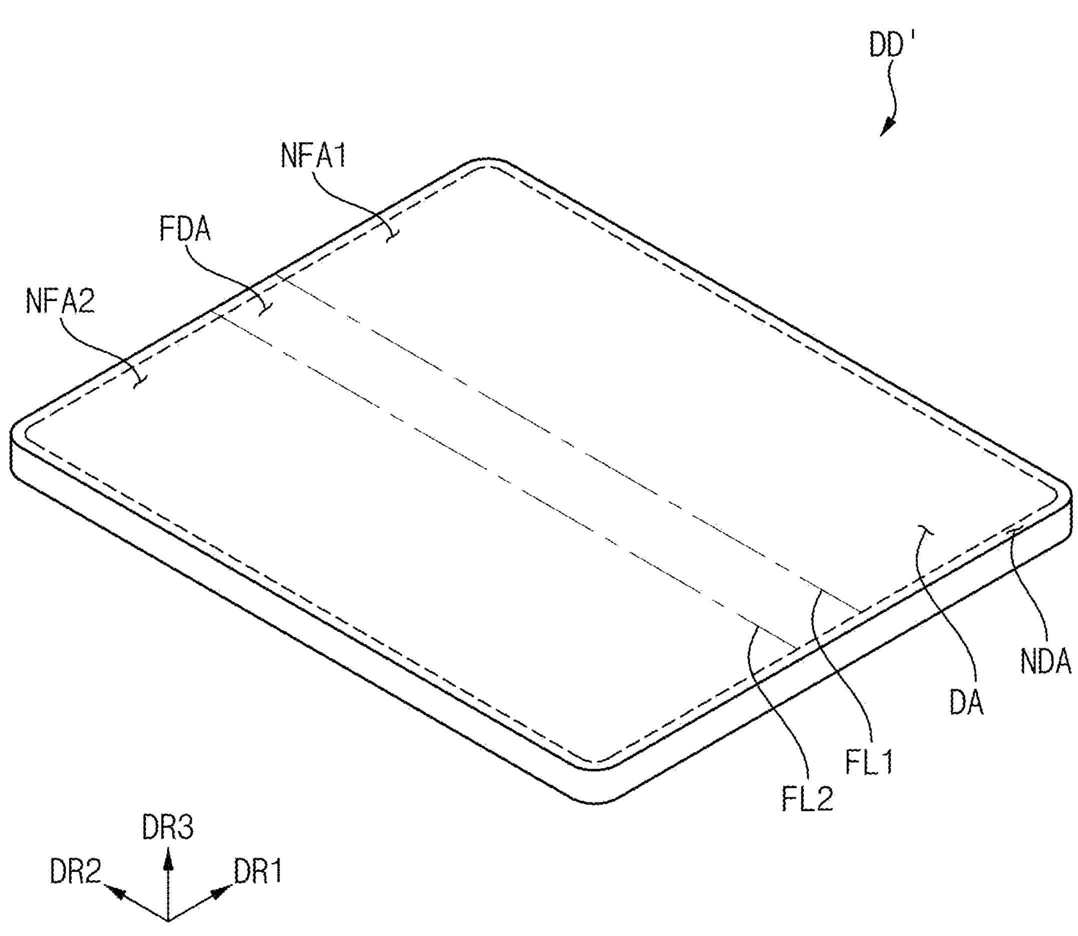
FIG. 2A is a perspective view illustrating an unfolded state of a display device according to one or more embodiments of the disclosure.
Figure 2B:
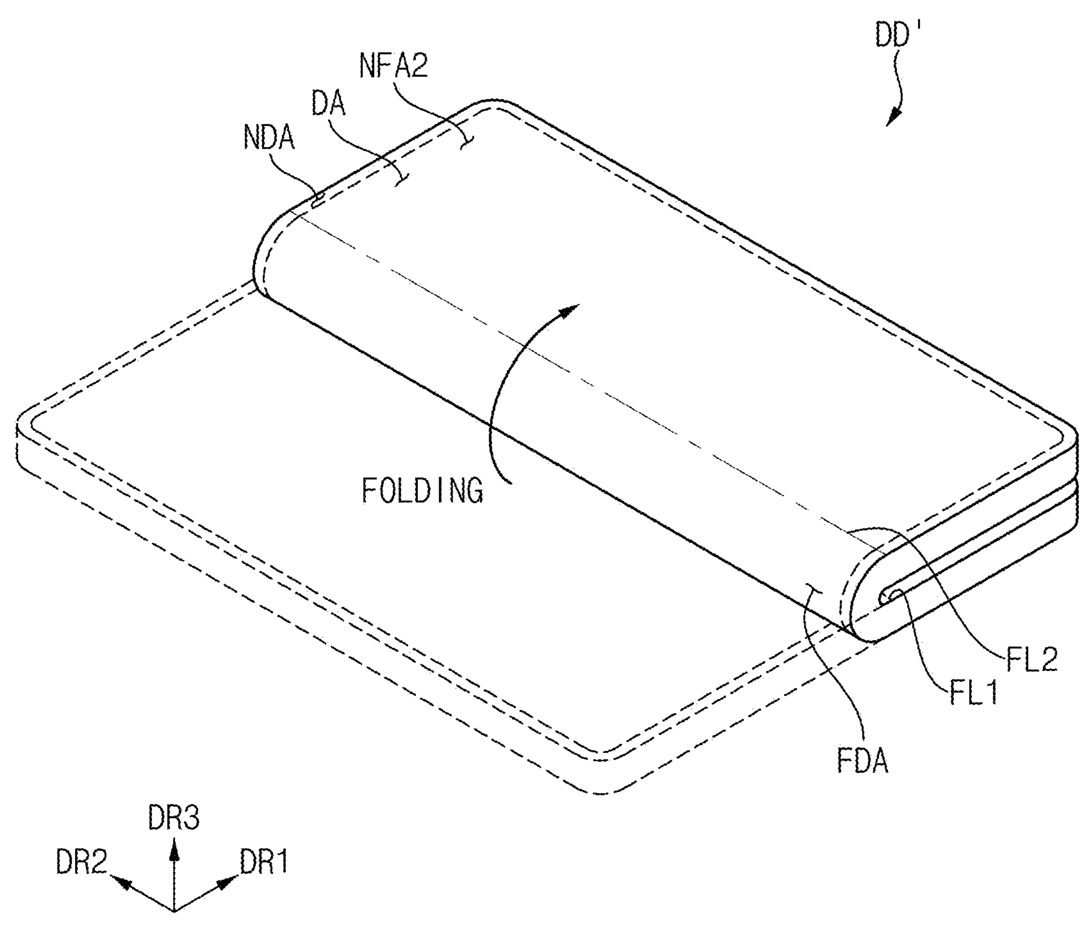
FIG. 2B is a perspective view illustrating a folded state of the display device of FIG. 2A according to one or more embodiments of the disclosure.
Figure 3:
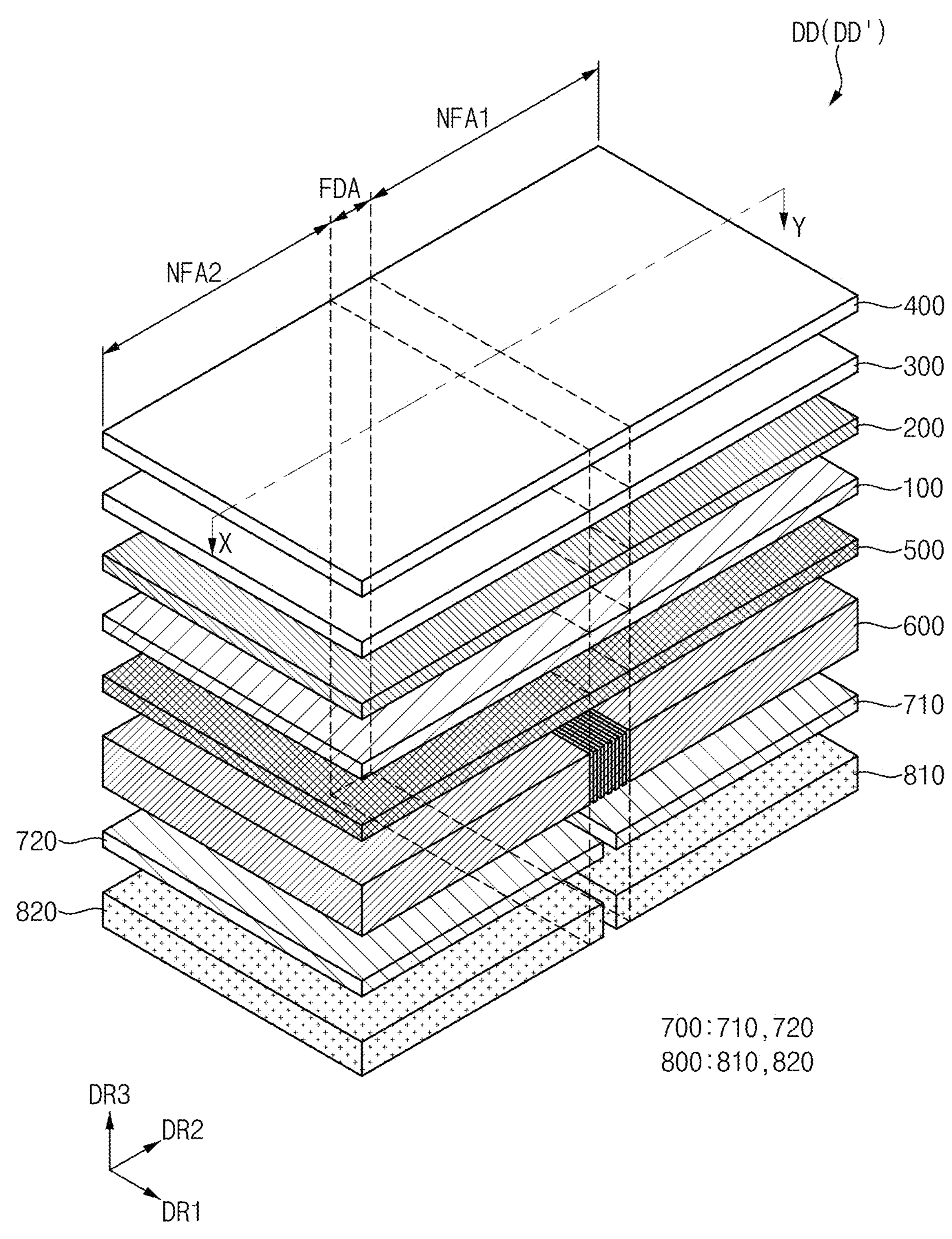
FIG. 3 is an exploded perspective view illustrating a plurality of components included in the display device of FIG. 1A or FIG. 2A according to one or more embodiments of the disclosure.

FIG. 1A is a perspective view illustrating an unfolded state of a display device according to one or more embodiments of the present disclosure. FIG. 1B is a perspective view illustrating a folded state of the display device of FIG. 1A. FIG. 2A is a perspective view illustrating an unfolded state of a display device according to one or more embodiments of the present disclosure. FIG. 2B is a perspective view illustrating a folded state of the display device of FIG. 2A. FIG. 3 is an exploded perspective view illustrating a plurality of components included in the display device of FIG. 1A or FIG. 2A according to one or more embodiments of the present disclosure.

Referring to FIGS. 1A, 1B, 2A, and 2B, display devices DD and DD' according to one or more embodiments may be each activated by an electrical signal. For example, each of the display devices DD and DD' may be a small display device used in small electronic devices such as smartphones, mobile phones, smart watches, game consoles, and cameras. However, embodiments of the present disclosure are not limited thereto, the display devices DD and DD' may each be a medium to large-sized display device used in medium to large-sized electronic devices such as laptops, tablet personal computers (PCs), televisions, computer monitors, vehicle monitors, and external billboards.

The display devices DD and DD' may each include a display area DA and a non-display area NDA. The display area DA may be an area (e.g., a region) that generates light or adjusts transmittance of light provided from an external light source to display an image. For example, in one or more embodiments, a plurality of pixels (e.g., a pixel PX of FIG. 5) may be arranged in the display area DA.

The non-display area NDA may be arranged around the display area DA. For example, in one or more embodiments, the non-display area NDA may be around (e.g., surround) at least a portion of the display area DA. In one or more embodiments, the non-display area NDA may be an area (e.g., a region) in which an image is not displayed. However, embodiments of the present disclosure are not limited thereto, for example, in one or more embodiments, an image may be displayed in at least a portion of the non-display area NDA. For example, in one or more embodiments, a light emitting element that emits light may be arranged in at least a portion of the non-display area NDA.

Each of the display devices DD and DD' may maintain a folded state or an unfolded state. For example, in one or more embodiments, the display devices DD and DD' may each be folded in an in-folding method in which the display area DA is arranged at an inside as illustrated in FIGS. 1B and 2B. When the display devices DD and DD' are each folded in the in-folding method, front surfaces of the display device DD may face each other, and front surfaces of the display device DD' may face each other. However, embodiments of the present disclosure are not limited thereto, and the display devices DD and DD' may be folded in an out-folding method in which the display area DA is arranged at an outside. When the display devices DD and DD' are each folded in the out-folding method, rear surfaces of the display device DD may face each other, and rear surfaces of the display device DD' may face each other.

In one or more embodiments, each of the display devices DD and DD' may include a folding area FDA, a first non-folding area NFA1, and a second non-folding area NFA2. The folding area FDA may be an area (e.g., a region) in which the display devices DD and DD' are bent or folded. The first non-folding area NFA1 and the second non-folding area NFA2 may be areas (e.g., regions) in which the display devices DD and DD' are not bent or folded. A first folding line FL1 may be a boundary between the folding area FDA and the first non-folding area NFA1. In addition, a second folding line FL2 may be a boundary between the folding area FDA and the second non-folding area NFA2. For example, in one or more embodiments, the first folding line FL1 and the second folding line FL2 may be parallel to each other.

The first non-folding area NFA1 may contact the folding area FDA. The first non-folding area NFA1 may contact one side of the folding area FDA. In one or more embodiments, as illustrated in FIGS. 1A and 1B, the first non-folding area NFA1 may contact an upper side of the folding area FDA. In one or more embodiments, as illustrated in FIGS. 2A and 2B, the first non-folding area NFA1 may contact a right side of the folding area FDA.

The second non-folding area NFA2 may contact the folding area FDA. The second non-folding area NFA2 may contact another side of the folding area FDA. In one or more embodiments, as illustrated in FIGS. 1A and 1B, the second non-folding area NFA2 may contact a lower side of the folding area FDA. In one or more embodiments, as illustrated in FIGS. 2A and 2B, the second non-folding area NFA2 may contact a left side of the folding area FDA. The folding area FDA may be arranged between the first non-folding area NFA1 and the second non-folding area NFA2.

In one or more embodiments, as illustrated in FIGS. 1A and 1B, each of the first folding line FL1 and the second folding line FL2 may extend in a first direction DR1. In these embodiments, the display device DD may be folded in a second direction DR2. Consequently, a length of the display device DD in the second direction DR2 may be reduced by approximately half. Accordingly, it may be convenient for a user to carry the display device DD.

In one or more embodiments, as illustrated in FIGS. 2A and 2B, each of the first folding line FL1 and the second folding line FL2 may extend in the second direction DR2. In these embodiments, the display device DD' may be folded in the first direction DR1. As a result, a length of the display device DD' in the first direction DR1 may be reduced by approximately half. Accordingly, it may be convenient for a user to carry the display device DD'.

One or more embodiments described hereafter may be equally applied to the display device DD of FIGS. 1A and 1B and the display device DD' of FIGS. 2A and 2B.

In one or more embodiments, the first direction DR1 and the second direction DR2 crossing the first direction DR1 may be defined. For example, the second direction DR2 may be substantially normal (e.g., perpendicular) to the first direction DR1. However, embodiments of the present disclosure are not limited thereto, for example, in one or more embodiments, the second direction DR2 may form an acute angle or an obtuse angle with the first direction DR1. In addition, a third direction DR3 crossing a plane formed by the first direction DR1 and the second direction DR2 may be defined. For example, the third direction DR3 may be substantially normal (e.g., perpendicular) to the plane formed by the first direction DR1 and the second directions DR2. However, embodiments of the present disclosure are not limited thereto, and the third direction DR3 may form an acute angle or an obtuse angle with the plane formed by the first direction DR1 and the second direction DR2.

FIG. 3 is an exploded perspective view illustrating a plurality of components included in the display device of FIG. 1A or FIG. 2A according to one or more embodiments of the present disclosure. FIG. 4 is a cross-sectional view of the display device of FIG. 3 taken along an X-Y line according to one or more embodiments of the present disclosure.

Referring to FIG. 3 and FIG. 4, the display devices DD and DD' according to one or more embodiments may each include a display panel 100, a polarizing film 200, a window 300, a protecting film 400, a panel lower member 500, a digitizer 600, a shielding member 700, and a heat radiating member 800.

The display panel 100 may include a plurality of pixels. For example, the display panel 100 may include a pixel PX. Each of the plurality of pixels may be to emit light. A cross-sectional structure of the pixel PX will be described later in more detail with reference to FIG. 5.

The polarizing film 200 may be arranged on the display panel 100. For example, in one or more embodiments, the polarizing film 200 may be arranged on a front surface of the display panel 100. The front surface of the display panel 100 may be a surface on which an image is displayed. The polarizing film 200 may be attached to the front surface of the display panel 100 by a first adhesive member AD1. For example, the first adhesive member AD1 may include an optical clear adhesive ("OCA"), an optical clear resin ("OCR"), or a pressure sensitive adhesive ("PSA"). For example, in one or more embodiments, the polarizing film 200 may include a phase delay film such as a linear flat plate or a λ/4 plate, but embodiments of the present disclosure are not limited thereto.

The window 300 may be arranged on the polarizing film 200. For example, in one or more embodiments, the window

300 may be arranged on a front surface of the polarizing film 200. The window 300 may be attached to the front surface of the polarizing film 200 by a second adhesive member AD2. For example, the second adhesive member AD2 may include an optical clear adhesive ("OCA"), an optical clear resin ("OCR"), or a pressure sensitive adhesive ("PSA"). For example, in one or more embodiments, the window 300 may be an ultra thin glass ("UTG") or a polyimide film, but embodiments of the present disclosure are not limited thereto.

The protecting film 400 may be arranged on the window 300. For example, in one or more embodiments, the protecting film 400 may be arranged on a front surface of the window 300. The protecting film 400 may be attached to the front surface of the window 300 by a third adhesive member AD3. For example, the third adhesive member AD3 may include an optical clear adhesive ("OCA"), an optical clear resin ("OCR"), or a pressure sensitive adhesive ("PSA"). The protecting film 400 may perform at least one of scattering prevention, shock absorption, scratch prevention, anti-fingerprint, or glare prevention of the window 300.

In one or more embodiments, as illustrated in FIG. 4, a light-blocking layer 410 may be arranged on a rear surface of the protecting film 400. The light-blocking layer 410 may be arranged on an edge of the protecting film 400. The light-blocking layer 410 may include a light-blocking material capable of blocking light. For example, in one or more embodiments, the light-blocking layer 410 may include an inorganic black pigment such as carbon black, an organic black pigment, and/or the like. These light-blocking materials may be used alone or in combination with each other.

The panel lower member 500 may be arranged under the display panel 100. For example, in one or more embodiments, the panel lower member 500 may be arranged on a rear surface of the display panel 100. The panel lower member 500 may be attached to the rear surface of the display panel 100 by a fourth adhesive member AD4. For example, the fourth adhesive member AD4 may include an optical clear adhesive ("OCA"), an optical clear resin ("OCR"), or a pressure sensitive adhesive ("PSA").

The panel lower member 500 may alleviate or absorb an impact applied to the display panel 100 from an outside of the display panel 100. Accordingly, the panel lower member 500 may prevent or reduce the display panel 100 from being damaged. The panel lower member 500 may be formed of a single layer or multiple layers. For example, in one or more embodiments, the panel lower member 500 may include rubber, a urethane-based material, an acrylic-based material, a foamed sponge, and/or the like. These materials may be used alone or in combination with each other.

In one or more embodiments, the panel lower member 500 may be arranged in the folding area FDA. For example, in one or more embodiments, the panel lower member 500 may be continuously arranged over the first non-folding area NFA1, the folding area FDA, and the second non-folding area NFA2. However, embodiments of the present disclosure are not limited thereto, for example, in one or more embodiments, the panel lower member 500 may not be arranged in the folding area FDA. For example, the panel lower member 500 may be divided into a first part arranged in the first non-folding area NFA1 and a second part arranged in the second non-folding area NFA2. In these embodiments, the display devices DD and DD' may be smoothly folded.

The digitizer 600 may be arranged under the panel lower member 500. For example, in one or more embodiments, the digitizer 600 may be arranged on a rear surface of the panel lower member 500. In one or more embodiments, the digitizer 600 may include a first non-folding part 610, a second non-folding part 620, and a folding part 630. The first non-folding part 610 may be a part arranged in the first non-folding area NFA1. The second non-folding part 620 may be a part arranged in the second non-folding area NFA2. The folding part 630 may be a part arranged in the folding area FDA. For example, the first non-folding part 610 may be arranged on one side of the folding part 630 in the second direction DR2, and the second non-folding part 620 may be arranged on another side of the folding part 630 in the second direction DR2. For example, the folding part 630 may be arranged between the first non-folding part 610 and the second non-folding part 620.

As the digitizer 600 includes the folding part 630 corresponding to the folding area FDA, during a folding operation of the display devices DD and DD', the digitizer 600 may secure flexibility, and thus a shape of the digitizer 600 may be easily changed. In one or more embodiments, the digitizer 600 may include a plurality of holes HL in the folding area FDA. For example, the folding part 630 of the digitizer 600 may include the plurality of holes HL. The plurality of holes HL may extend in the third direction DR3. The plurality of holes HL may be repeatedly arranged to be spaced and/or apart (e.g., spaced apart or separated) from each other in the second direction DR2.

The digitizer 600 may have a structure in which prepregs are stacked. For example, in one or more embodiments, the digitizer 600 may have a structure in which first prepregs parallel to the first folding line (for example, the first folding line FL1 of FIG. 1A) and the second folding line (for example, the second folding line FL2 of FIG. 1A) and second prepregs substantially normal (e.g., perpendicular) to the first folding line and the second folding line are alternately stacked. The first prepregs and the second prepregs may be stacked by a thermo-press or an auto-clave. Here, the prepreg may refer to a reinforcement material (or reinforcement fabric) pre-impregnated with resin.

A base layer on which sensing coils (e.g., a first sensing coil RF of FIG. 6 or a second sensing coil CF of FIG. 7) of the digitizers 600 are arranged may include a reinforcement fiber composite. The digitizer 600 may include a reinforcement fiber arranged inside a matrix part. The reinforcing fiber may be carbon fibers and/or glass fibers.

Non-limiting examples of materials which may be used as the reinforcement fiber may include epoxy, polyester, polyamide, polycarbonates, polypropylene, polybutylene, vinyl ester, and/or the like. These materials may be used alone or in combination with each other. For example, in one or more embodiments, the matrix part may include a polymer resin. The matrix part may include a thermoplastic resin.

The digitizer 600 may include electrode patterns for sensing an approach or contact of an electronic pen, such as a stylus pen supporting an electromagnetic resonance ("EMR"). For example, in one or more embodiments, the digitizer 600 may detect a magnetic field or an electromagnetic signal emitted from the electronic pen based on the electrode patterns, and determine a point at which the sensed magnetic field or electromagnetic signal is the largest as a touch coordinate.

The digitizer 600 may be attached to the rear surface of the panel lower member 500 by a fifth adhesive member AD5. In one or more embodiments, the fifth adhesive member AD5 may not be arranged or provided in the folding area FDA to reduce folding stress of the display devices DD and DD'. For example, the fifth adhesive member AD5 may include an optical clear adhesive ("OCA"), an optical clear resin ("OCR"), or a pressure sensitive adhesive ("PSA").

In one or more embodiments, as illustrated in FIG. 4, a buffer member 650 may be arranged under the digitizer 600. The buffer member 650 may be attached to a rear surface of the digitizer 600 by a sixth adhesive member AD6. In one or more embodiments, the sixth adhesive member AD6 may not be arranged or provided in the folding area FDA to reduce folding stress of the display devices DD and DD'. For example, the sixth adhesive member AD6 may include an optical clear adhesive ("OCA"), an optical clear resin ("OCR"), or a pressure sensitive adhesive ("PSA").

The buffer member 650 may be to absorb an external impact to prevent or reduce the digitizer 600 from being damaged. For example, the buffer member 650 may include rubber, a urethane-based material, an acrylic-based material, a foam-molded sponge, and/or the like. These materials may be used alone or in combination with each other.

The shielding member 700 may be arranged under the buffer member 650. For example, in one or more embodiments, the shielding member 700 may be arranged on a rear surface of the buffer member 650. The shielding member 700 may be attached to the rear surface of the buffer member 650 by a seventh adhesive member AD7. In one or more embodiments, the seventh adhesive member AD7 may not be arranged or provided in the folding area FDA to reduce folding stress of the display devices DD and DD'. For example, the seventh adhesive member AD7 may include an optical clear adhesive ("OCA"), an optical clear resin ("OCR"), or a pressure sensitive adhesive ("PSA"). The shielding member 700 may include a first shielding member 710 and a second shielding member 720. The first shielding member 710 may be a portion arranged in the first non-folding area NFA1 and the folding area FDA. The second shielding member 720 may be a portion arranged in the second non-folding area NFA2 and the folding area FDA. As the first shielding member 710 and the second shielding member 720 are spaced and/or apart (e.g., spaced apart or separated) in plan view, a gap between the first shielding member 710 and the second shielding member 720 may be defined. The gap between the first shielding member 710 and the second shielding member 720 may be arranged in at least a portion of the folding area FDA. For example, in one or more embodiments, the shielding member 700 is positioned under the buffer member 650. For instance, it may be placed on the rear surface of the buffer member 650 and attached using the seventh adhesive member AD7. This adhesive may not be present in the folding area FDA to reduce folding stress on the display devices DD and DD'. The seventh adhesive member AD7 could be an optical clear adhesive (OCA), optical clear resin (OCR), or pressure sensitive adhesive (PSA). The shielding member 700 is composed of a first shielding member 710 and a second shielding member 720. The first shielding member 710 is located in the first non-folding area NFA1 and the folding area FDA, while the second shielding member 720 is in the second non-folding area NFA2 and the folding area FDA. There is a gap between the first and second shielding members 710 and 720 in the folding area FDA. In the present context and unless defined otherwise, "plan view" refers to a view from above, looking down on the object. By way of example, the "object" here may refer to the shielding member 700 and its components (the first shielding member 710 and the second shielding member 720) as they are arranged in relation to the buffer member 650 and the folding area FDA. The plan view is a top-down view of how these components are positioned and spaced apart from each other.

For example, in one or more embodiments, each of the first shielding member 710 and the second shielding member 720 may include a magnetic metal powder so that a magnetic field or an electromagnetic signal passing through the digitizer 600 may flow into the first shielding member 710 and the second shielding member 720. Therefore, the first shielding member 710 and the second shielding member 720 may reduce emission of a magnetic field or an electromagnetic signal to rear surfaces of the first shielding member 710 and the second shielding member 720.

The heat radiating member 800 may be arranged under the shielding member 700. For example, in one or more embodiments, the heat radiating member 800 may be arranged on a rear surface of the shielding member 700. The heat radiating member 800 may include a first heat radiating member 810 and a second heat radiating member 820. The first heat radiating member 810 may be arranged on a rear surface of the first shielding member 710, and the second heat radiating member 820 may be arranged on a rear surface of the second shielding member 720. For example, the first heat radiating member 810 may be a portion arranged in the first non-folding area NFA1 and the folding area FDA, and the second heat radiating member 820 may be a portion arranged in the second non-folding area NFA2 and the folding area FDA.

Each of the first heat radiating member 810 and the second heat radiating member 820 may include a metal material having excellent or suitable thermal conductivity. For example, in one or more embodiments, each of the first heat radiating member 810 and the second heat radiating member 820 may include copper, nickel, ferrite, silver, and/or the like. These materials may be used alone or in combination with one another. As a result, heat generated by the display devices DD and DD' may be discharged to an outside of the display devices DD and DD' by the first heat radiating member 810 and the second heat radiating member 820.

Figure 5:
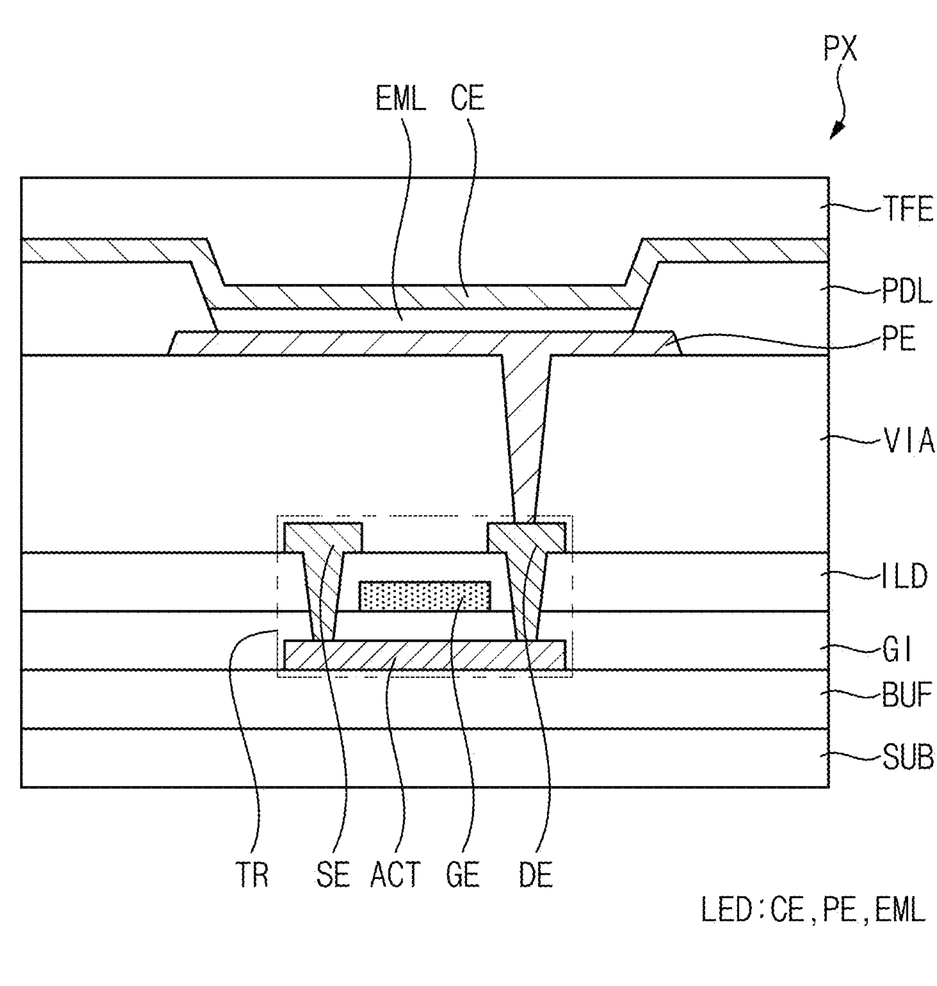
FIG. 5 is a cross-sectional view illustrating a pixel included in the display panel of FIG. 4 according to one or more embodiments of the disclosure.

FIG. 5 is a cross-sectional view illustrating a pixel included in the display panel of FIG. 4 according to one or more embodiments of the disclosure.

Referring to FIG. 5, the pixel PX may include a substrate SUB, a buffer layer BUF, a gate insulating layer GI, an interlayer insulating layer ILD, a via insulating layer VIA, an active layer ACT, a source electrode SE, a gate electrode GE, a drain electrode DE, a pixel defining layer PDL, a light emitting element LED, and an encapsulating layer TFE.

A transistor TR may include the active layer ACT, the source electrode SE, the gate electrode GE, and the drain electrode DE. The light emitting element LED may include a pixel electrode PE, a light emitting layer EML, and a common electrode CE.

The substrate SUB may include a transparent material or an opaque material. In one or more embodiments, the substrate SUB may be (e.g., formed of) a transparent resin substrate. Example of the transparent resin substrate may include a polyimide substrate. In these embodiments, the polyimide substrate may include a first organic layer, a first barrier layer, a second organic layer, and/or the like.

In one or more embodiments, the substrate SUB may include a quartz substrate (e.g., a synthetic quartz substrate, a fluorine-doped quartz substrate), a calcium fluoride substrate, a soda lime glass substrate, a non-alkali glass substrate, and/or the like. These materials may be used alone or in combination with each other.

The buffer layer BUF may be arranged on the substrate SUB. The buffer layer BUF may prevent or reduce metal atoms or impurities from diffusing from the substrate SUB to the transistor TR. In addition, the buffer layer BUF may improve flatness of a surface of the substrate SUB if (e.g., when) the surface of the substrate SUB is not uniform.

For example, in one or more embodiments, the buffer layer BUF may include an inorganic material such as silicon oxide, silicon nitride, silicon oxynitride, and/or the like. These materials may be used alone or in combination with each other.

The active layer ACT may be arranged on the buffer layer BUF. The active layer ACT may include an inorganic semiconductor (e.g., amorphous silicon, polysilicon, a metal oxide semiconductor), an organic semiconductor, and/or the like. These materials may be used alone or in combination with each other. The active layer ACT may include a source area, a drain area, and a channel area arranged between the source area and the drain area.

The metal oxide semiconductor may include a binary compound ("$AB_x$"), a ternary compound ("$AB_xC_y$"), a quaternary compound ("$AB_xC_yD_z$"), and/or the like including indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and/or the like. These materials may be used alone or in combination with each other.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), and/or indium gallium zinc oxide ("IGZO"). These materials may be used alone or in combination with each other.

The gate insulating layer GI may be arranged on the buffer layer BUF. The gate insulating layer GI may sufficiently cover the active layer ACT. For example, The gate insulating layer GI may cover the active layer ACT and may be arranged along a profile of the active layer ACT.

For example, the gate insulating layer GI may include one or more inorganic materials such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), and/or the like. These materials may be used alone or in combination with each other.

The gate electrode GE may be arranged on the gate insulating layer GI. The gate electrode GE may overlap the channel area of the active layer ACT in the plan view.

The gate electrode GE may include a metal, an alloy, a metal nitride, a conductive metal oxide, a transparent conductive material, and/or the like. Non-limiting examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and/or the like. These materials may be used alone or in combination with each other.

Non-limiting examples of the conductive metal oxide may include Indium tin oxide, indium zinc oxide, and/or the like. These materials may be used alone or in combination with each other. In addition, non-limiting examples of the metal nitride may include aluminum nitride ("$AlN_x$"), tungsten nitride ("$WN_x$"), chromium nitride ("$CrN_x$"), and/or the like. These materials may be used alone or in combination with each other.

The interlayer insulating layer ILD may be arranged on the gate insulating layer GI. The interlayer insulating layer ILD may sufficiently cover the gate electrode GE. For example, the interlayer insulating layer ILD may cover the gate electrode GE, and may be arranged along a profile of the gate electrode GE.

For example, the interlayer insulating layer ILD may include one or more inorganic materials such as silicon oxide, silicon nitride, silicon carbide, silicon oxynitride, silicon oxycarbide, and/or the like. These materials may be used alone or in combination with each other.

The source electrode SE may be arranged on the interlayer insulating layer ILD. The source electrode SE may be connected to the source area of the active layer ACT through a contact hole penetrating the gate insulating layer GI and the interlayer insulating layer ILD.

The drain electrode DE may be arranged on the interlayer insulating layer ILD. The drain electrode DE may be connected to the drain area of the active layer ACT through a contact hole penetrating the gate insulating layer GI and the interlayer insulating layer ILD.

For example, the source electrode SE may include a metal, an alloy, a metal nitride, a conductive metal oxide, a transparent conductive material, and/or the like. These materials may be used alone or in combination with each other. The drain electrode DE and the source electrode SE may be formed through the same process and may include the same material.

The via insulating layer VIA may be arranged on the interlayer insulating layer ILD. The via insulating layer VIA may sufficiently cover the source electrode SE and the drain electrode DE. The via insulating layer VIA may include an organic material. For example, in one or more embodiments, the via insulating layer VIA may include one or more organic materials such as a phenolic resin, an acrylic resin, a polyimide resin, a polyamide resin, a siloxane resin, an epoxy resin, and/or the like. These materials may be used alone or in combination with each other.

The pixel electrode PE may be arranged on the via insulating layer VIA. In one or more embodiments, the pixel electrode PE may be connected to the drain electrode DE through a contact hole penetrating the via insulating layer VIA.

The pixel electrode PE may include a metal, an alloy, a metal nitride, a conductive metal oxide, a transparent conductive material, and/or the like. These materials be used alone or in combination with each other. In one or more embodiments, the pixel electrode PE may have a stacked structure including ITO/Ag/ITO. For example, the pixel electrode PE may operate as an anode.

The pixel defining layer PDL may be arranged on the via insulating layer VIA. The pixel defining layer PDL may cover side portions of the pixel electrode PE. In addition, an opening exposing a portion of an upper surface of the pixel electrode PE may be defined in the pixel defining layer PDL.

For example, the pixel defining layer PDL may include an inorganic material and/or an organic material. In one or more embodiments, the pixel defining layer PDL may include an organic material such as an epoxy resin, a siloxane resin, and/or the like. These materials may be used alone or in combination with each other. In one or more embodiments, the pixel defining layer PDL may further include a light blocking material containing a black pigment, a black dye, and/or the like.

The light emitting layer EML may be arranged on the pixel electrode PE. The light emitting layer EML may include an organic material that is to emit light of a set or predetermined color. For example, in one or more embodiments, the light emitting layer EML may include an organic material that is to emit red light. However, embodiments of the present disclosure are not limited thereto, and the light emitting layer EML may be to emit light of a color different from red light.

The common electrode CE may be arranged on the light emitting layer EML and the pixel defining layer PDL. The common electrode CE may include a metal, an alloy, a metal nitride, a conductive metal oxide, a transparent conductive material, and/or the like. These materials may be used alone or in combination with each other. The common electrode CE may operate as a cathode.

The encapsulation layer TFE may be arranged on the common electrode CE. The encapsulation layer TFE may prevent or reduce impurities and moisture from penetrating into the pixel electrode PE, the light emitting layer EML, and the common electrode CE from the outside. The encapsulation layer TFE may include at least one inorganic layer and at least one organic layer.

For example, the inorganic layer may include silicon oxide, silicon nitride, silicon oxynitride, and/or the like. These materials may be used alone or in combination with each other. The organic layer may include a cured polymer product such as polyacrylate.

Although one or more embodiments of the pixel PX have been described with reference to FIG. 5, the pixel PX is not limited to the structure illustrated in FIG. 5. For example, the pixel PX may include any structure that receives an electrical signal and emits light having a luminance corresponding to the intensity of the electrical signal.

Figure 6:
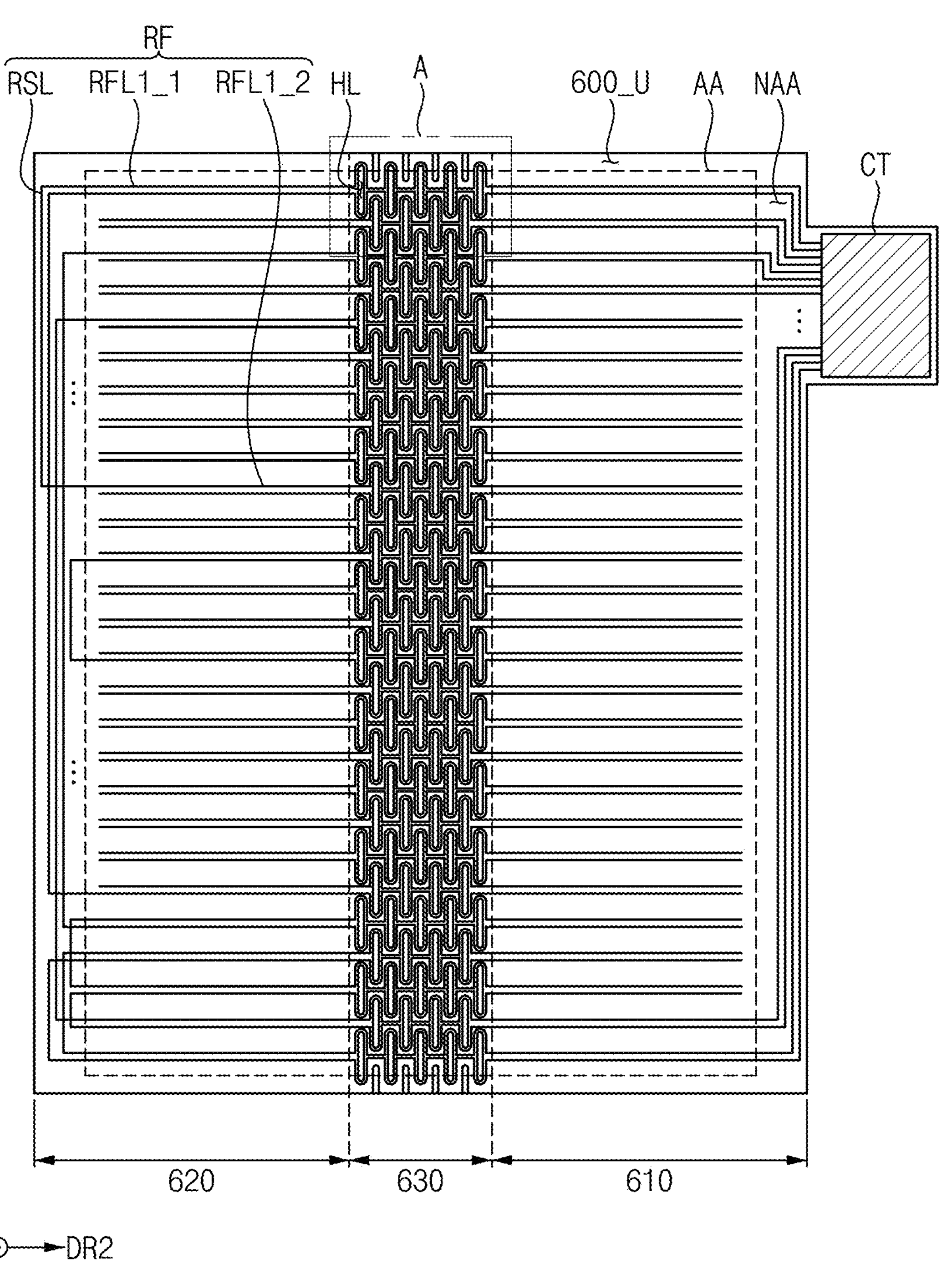
FIG. 6 is a plan view illustrating a front surface of the digitizer of FIG. 3 according to one or more embodiments of the disclosure.
Figure 7:
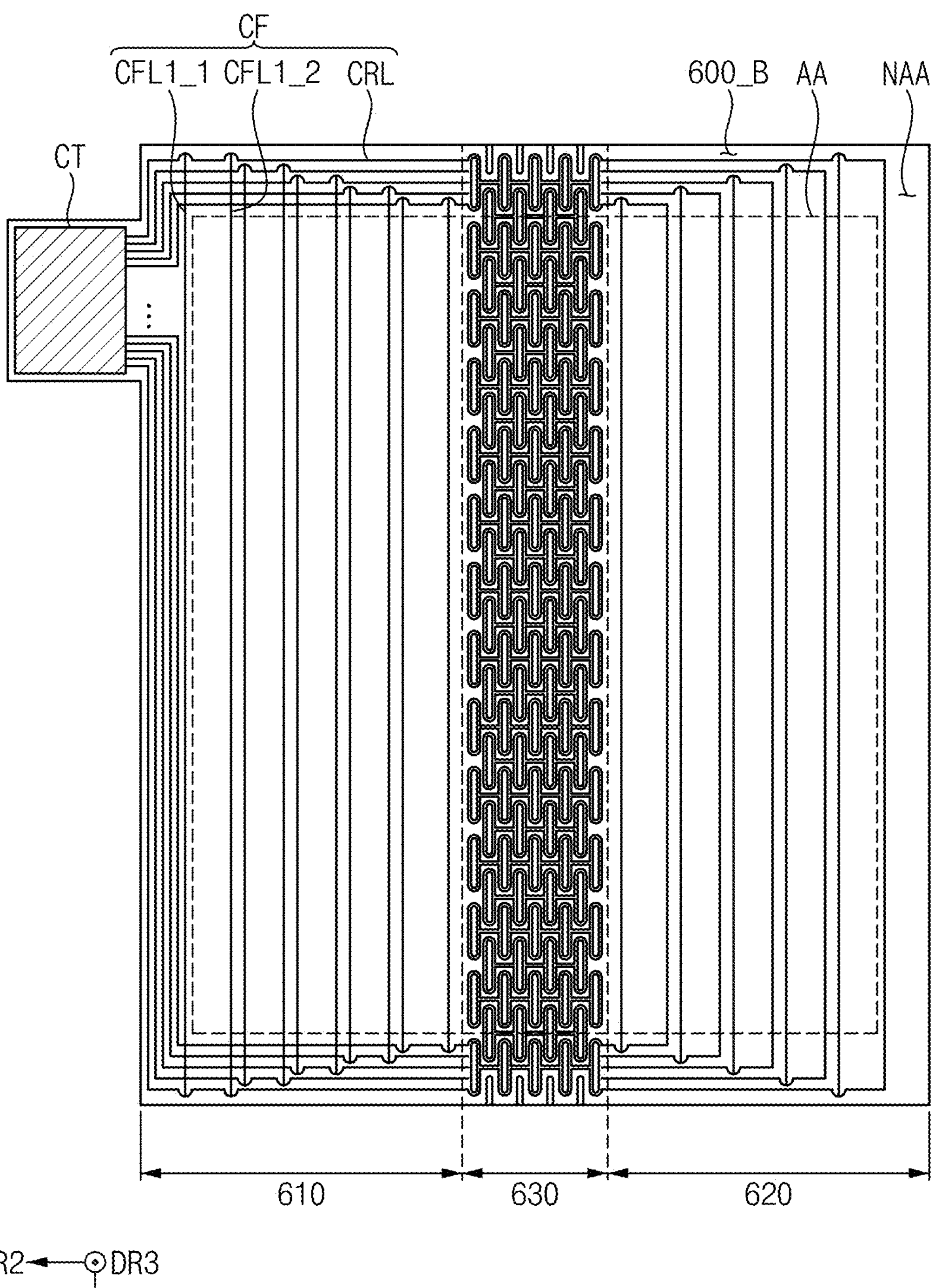
FIG. 7 is a plan view illustrating a rear surface of the digitizer of FIG. 3 according to one or more embodiments of the disclosure.

FIG. 6 is a plan view illustrating a front surface of the digitizer of FIG. 3 according to one or more embodiments of the present disclosure. FIG. 7 is a plan view illustrating a rear surface of the digitizer of FIG. 3 according to one or more embodiments of the present disclosure.

For example, FIG. 6 may illustrate sensing coils arranged on a front surface 600_U of the digitizer 600, and FIG. 7 may illustrate sensing coils arranged on a rear surface 600_B of the digitizer 600.

Referring to FIGS. 6 and 7, in one or more embodiments, the digitizer 600 may include an active area AA and a surrounding area NAA. The digitizer 600 may include first sensing coils RF, second sensing coils CF, and a connector CT.

In one or more embodiments, the active area AA of the digitizer 600 may overlap the display area (for example, the display area DA of FIG. 1A) of the display device (for example, the display device DD of FIG. 1A) in plan view. For example, the active area AA of the digitizer 600 may correspond to the display area of the display device. However, embodiments of the disclosure are not limited thereto, and the active area AA of the digitizer 600 may also partially overlap the non-display area (for example, the non-display area NDA of FIG. 1A) of the display device in plan view.

In one or more embodiments, the surrounding area NAA of the digitizer 600 may overlap the non-display area of the display device in plan view. For example, the surrounding area NAA of the digitizer 600 may correspond to the non-display area of the display device. However, embodiments of the disclosure are not limited thereto, for example, in one or more embodiments, the surrounding area NAA of the digitizer 600 may at least partially overlap the display area of the display device in plan view.

In one or more embodiments, the active area AA may be defined as an area for sensing an input of a pen (e.g., an electronic pen). In addition, the surrounding area NAA may be an area in which connecting wires for forming a loop of each of the first sensing coils RF and the second sensing coils CF are arranged. In the surrounding area NAA, the connecting wires for forming the loop of each of the first sensing coils RF and the second sensing coils CF may be densely arranged.

In one or more embodiments, the digitizer 600 may include the first sensing coils RF and the second sensing coils CF. In one or more embodiments, the first sensing coils RF may be arranged on the front surface 600_U of the digitizer 600. In addition, the second sensing coils CF may be arranged on the rear surface 600_B of the digitizer 600.

The first sensing coils RF may include first long sides RFL1_1, second long sides RFL1_2, and short sides RSL. Each of the first long sides RFL1_1 and the second long sides RFL1_2 may extend in the second direction DR2. Each of the short sides RSL extends in the first direction DR1, and may connect one end of one of the first long sides RFL1_1 and one end of one of the second long sides RFL1_2 to each other.

The first sensing coils RF may form a plurality of loops. For example, each of the plurality of loops formed by the first sensing coils RF may have a shape extending in the second direction DR2, for example, in a horizontal direction. For example, each of the plurality of loops formed by the first sensing coils RF may have a long side extending in the second direction DR2, for example, in the horizontal direction. In addition, each of the plurality of loops formed by the first sensing coils RF may have a short side extending in the first direction DR1, for example, in a vertical direction. For example, the plurality of loops formed by the first sensing coils RF may be referred to as a horizontal loop.

In one or more embodiments, the plurality of loops formed by the first sensing coils RF may include a plurality of loops each having a different length in the first direction DR1. For example, a length of each of the short sides RSL constituting the short sides of the plurality of loops formed by the first sensing coils RF may be different for each loop in the first direction DR1. For example, widths in the first direction DR1 between each of the first long sides RFL1_1 and each of the second long sides RFL1_2 may be different from each other. However, embodiments of the present disclosure are not limited thereto, for example, in one or more embodiments, the plurality of loops formed by the first sensing coils RF may include a plurality of loops each having substantially same length in the first direction DR1. In these embodiments, each of the short sides RSL constituting the short sides of the plurality of loops formed by the first sensing coils RF may have substantially same length in the first direction DR1.

Shapes of the plurality of loops formed by the first sensing coils RF may be variously changed according to one or more embodiments. For example, the shape of the plurality of loops formed by the first sensing coils RF may have any shape extending in the second direction DR2.

In one or more embodiments, some of the first long sides RFL1_1 crossing the folding part 630 of the digitizer 600 may extend from the first non-folding part 610 to the second non-folding part 620 passing between the plurality of holes HL. In addition, some of the second long sides RFL1_2 crossing the folding part 630 of the digitizer 600 may extend from the first non-folding part 610 to the second non-folding part 620 passing between the plurality of holes HL.

Each of the first sensing coils RF may be connected to the connector CT. For example, one end of each of the first sensing coils RF may be connected to the connector CT in the surrounding area NAA.

FIG. 6 may illustrate an embodiment in which the first sensing coils RF are arranged on the front surface 600_U of the digitizer 600, but this is for convenience of description, and some of the first sensing coils RF may be arranged on the rear surface 600_B of the digitizer 600.

The second sensing coils CF may include third long sides CFL1_1, fourth long sides CFL1_2, and routing lines CRL. Each of the third long sides CFL1_1 and the fourth long sides CFL1_2 may extend in the first direction DR1. Each of the routing lines CRL may extend in the second direction DR2, and may connect one end of one of the third long sides CFL1_1 and one end of one of the fourth long sides CFL1_2 to each other.

The second sensing coils CF may form a plurality of loops. For example, each of the plurality of loops formed by the second sensing coils CF may have a shape extending in the first direction DR1, for example, in the vertical direction. For example, each of the plurality of loops formed by the second sensing coils CF may have a long side extending in the first direction DR1, for example, in the vertical direction. In addition, each of the plurality of loops formed by the second sensing coils CF may have a short side extending in the second direction DR2, for example, in the horizontal direction. For example, the plurality of loops formed by the second sensing coils CF may be referred to as a vertical loop.

In one or more embodiments, the plurality of loops formed by the second sensing coils CF may include a plurality of loops each having different lengths in the second direction DR2. For example, a length of each of the routing lines CRL constituting the short sides of the plurality of loops formed by the second sensing coils CF may be different for each loop in the second direction DR2. For example, widths in the second direction DR2 between each of the third long sides CFL1_1 and each of the fourth long sides CFL1_2 may be different from each other. In these embodiments, the short side of the plurality of loops formed by the second sensing coils CF may be a portion of the routing lines CRL except for a portion extending from the loop in order to connect the loop and the connector CT. However, embodiments of the present disclosure are not limited thereto, for example, in one or more embodiments, the plurality of loops formed by the second sensing coils CF may include a plurality of loops having substantially same length in the second direction DR2. In these embodiments, a length of each of the routing lines CRL constituting the short sides of the plurality of loops formed by the second sensing coils CF may be substantially the same in the second direction DR2.

Shapes of the plurality of loops formed by the second sensing coils CF may be variously changed according to one or more embodiments. For example, the shape of the plurality of loops formed by the second sensing coils CF may have any shape extending in the first direction DR1.

Although not illustrated in FIG. 7 for not obscuring the drawing, some of the third long sides CFL1_1 arranged in the folding part 630 of the digitizer 600 may extend in the first direction DR1 as a whole, passing between the plurality of holes HL. In addition, some of the fourth long sides CFL1_2 arranged in the folding part 630 of the digitizer 600 may extend in the first direction DR1 as a whole, passing between the plurality of holes HL. In addition, some of the routing lines CRL arranged in the folding part 630 may each be connected to one end of one of the third long sides CFL1_1 and one end of one of the fourth long sides CFL1_2, passing between the plurality of holes HL.

Each of the second sensing coils CF may be connected to the connector CT. For example, one end of each of the second sensing coils CF may be connected to the connector CT in the surrounding area NAA.

FIG. 7 may illustrate an example embodiment in which the second sensing coils CF are arranged on the rear surface 600_B of the digitizer 600, but this is for convenience of description, and some of the second sensing coils CF may be arranged on the front surface 600_U of the digitizer 600.

When an electric current flows through the second sensing coils CF, a magnetic force line may be induced between the second sensing coils CF and the first sensing coils RF. The first sensing coils RF may sense an induced electromagnetic force emitted from the electronic pen or electromagnetic pen and output it to one terminal of each of the first sensing coils RF as a sensing signal. One terminal of each of the first sensing coils RF may be connected to signal line(s) arranged in the around (e.g., surrounding) area NAA. For example, in one or more embodiments, when an electric current flows through the second sensing coils CF, a magnetic force line is induced between the second sensing coils CF and the first sensing coils RF. The first sensing coils RF detect the induced electromagnetic force from an electronic pen or electromagnetic pen and output it as a sensing signal to one terminal of each of the first sensing coils RF. These terminals are connected to signal lines arranged in the surrounding area NAA.

Hereinafter, one or more embodiments of arrangement of a plurality of loops included in the digitizer 600 and arrangement of wires included in the plurality of loops will be described.

Figure 8:
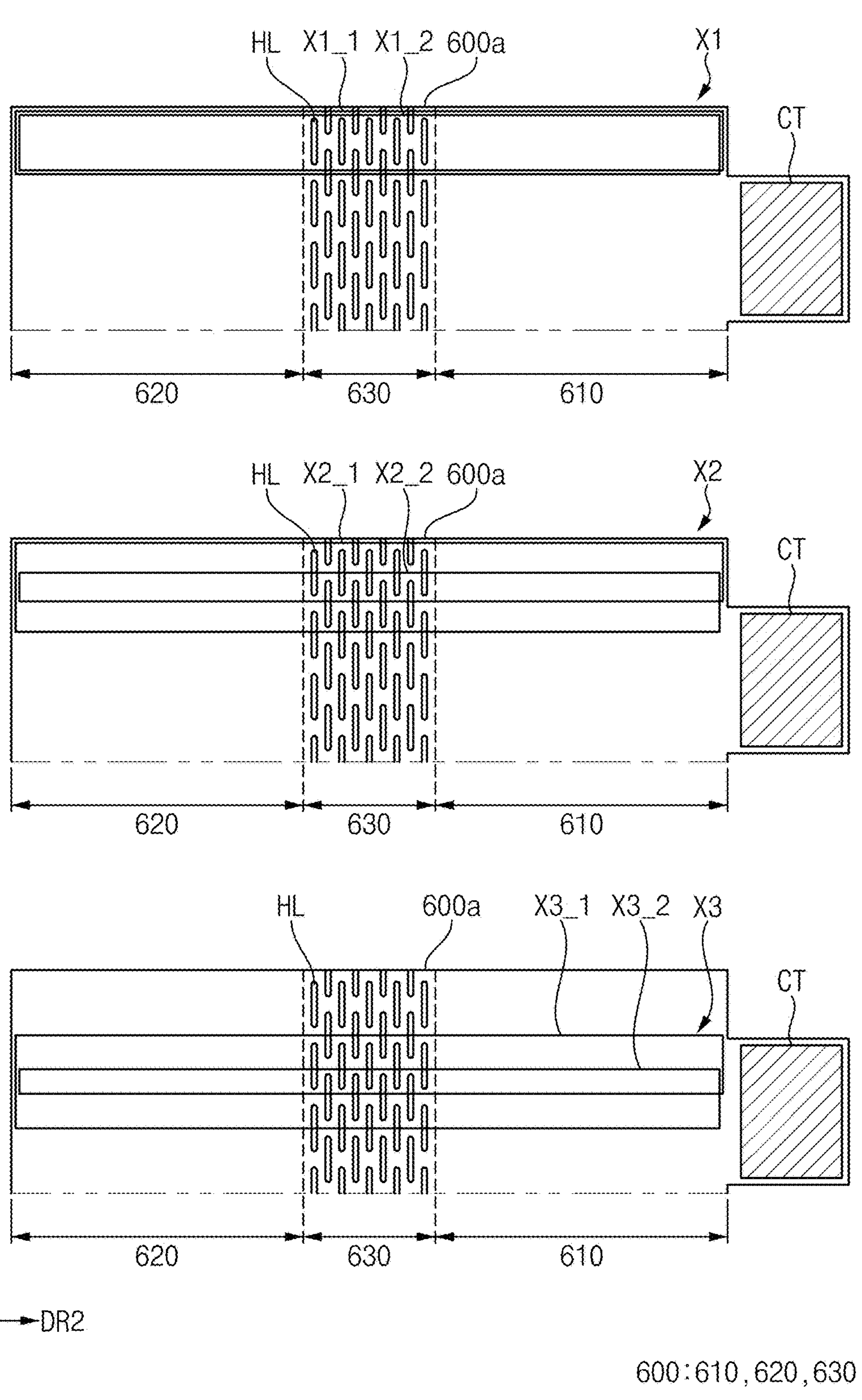
FIG. 8 is a plan view illustrating horizontal loops of the digitizer of FIG. 3 according to one or more embodiments of the disclosure.
Figure 9:
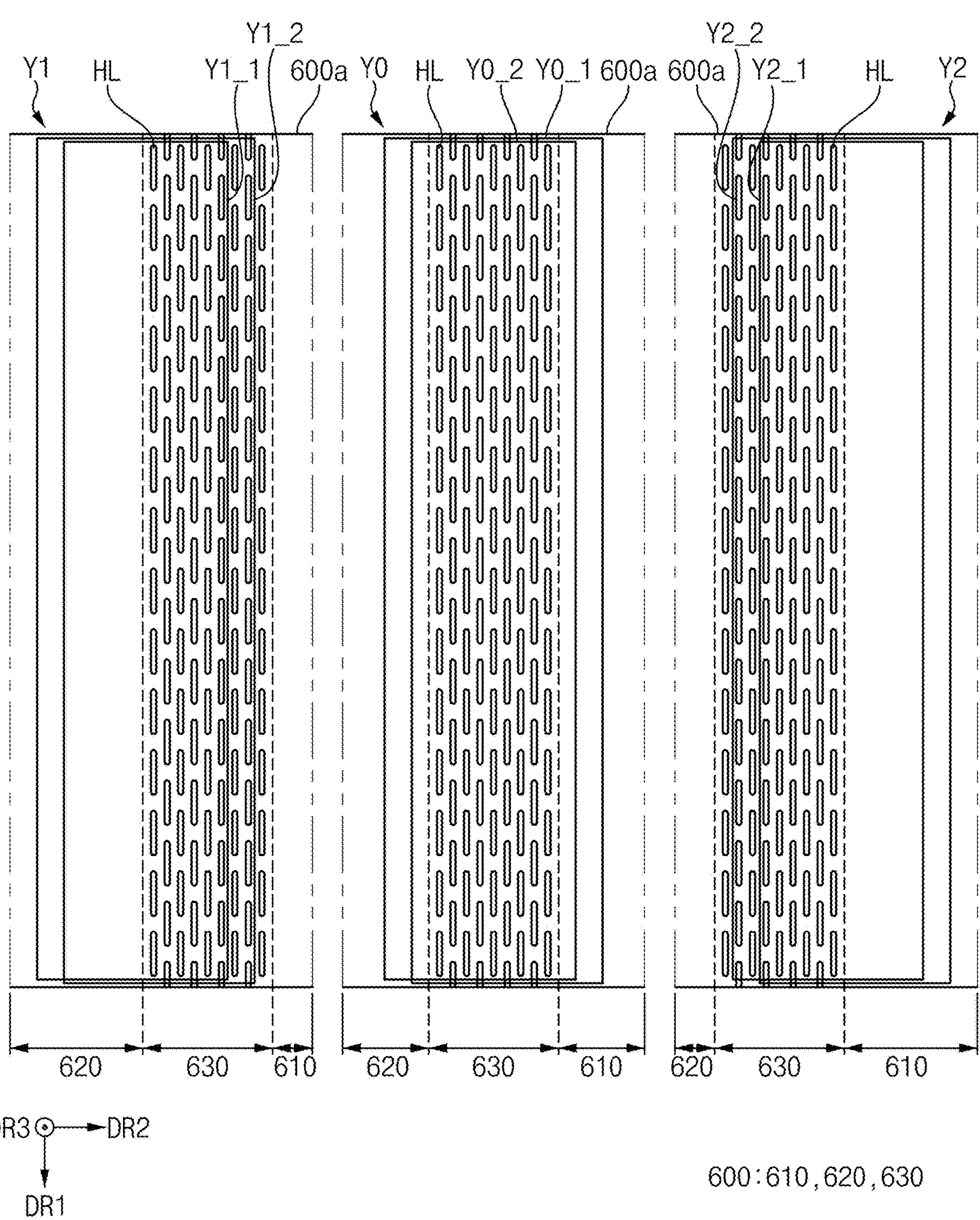
FIGS. 9 and 10 are each a plan view illustrating vertical loops of the digitizer of FIG. 3 according to one or more embodiments of the disclosure.
Figure 10:
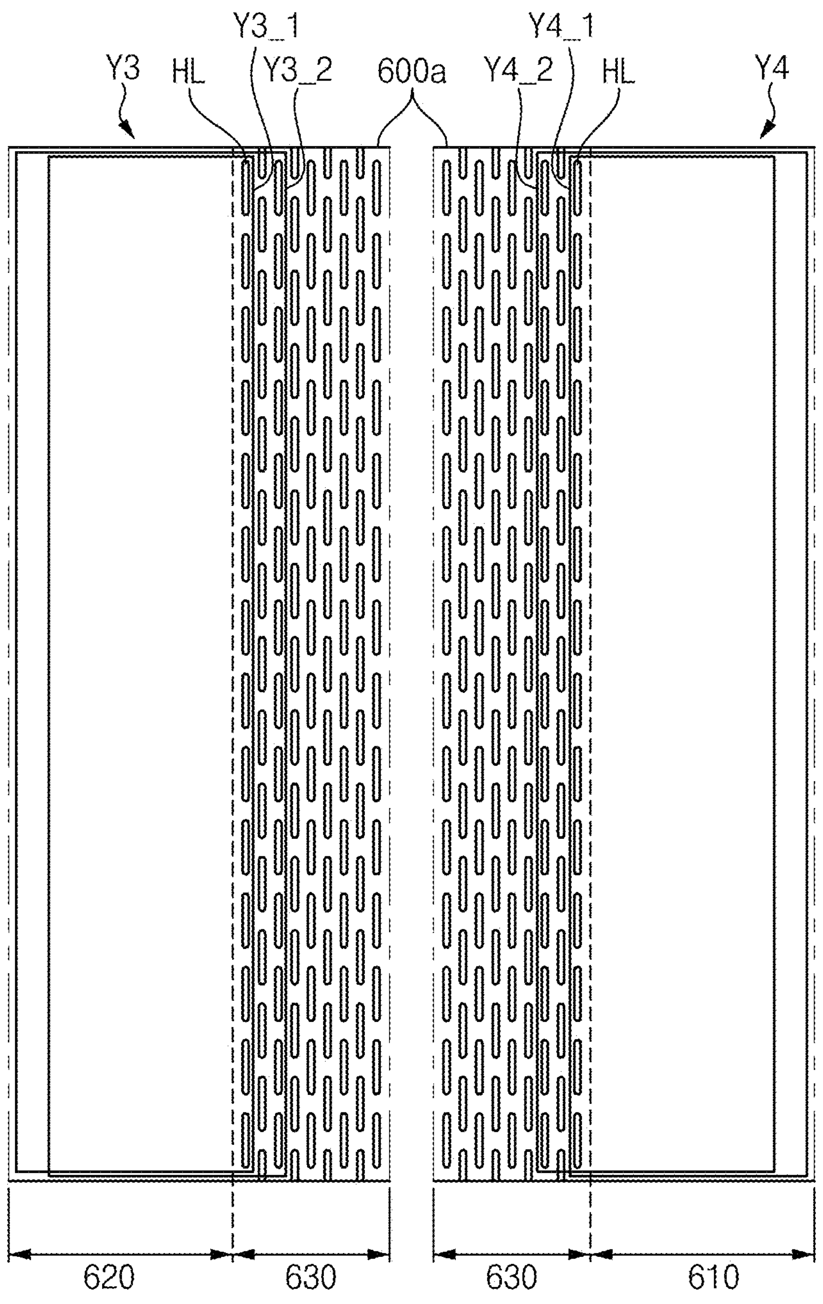
Figure 10:
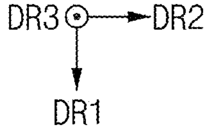

FIG. 8 is a plan view illustrating horizontal loops of the digitizer of FIG. 3 according to one or more embodiments of the present disclosure. FIGS. 9 and 10 are each a plan view illustrating vertical loops of the digitizer of FIG. 3 according to one or more embodiments of the present disclosure.

Referring to FIGS. 8, 9, and 10, the digitizer 600 may include horizontal loops X1, X2, and X3 each having a long side extending in the second direction DR2 and vertical loops Y0, Y1, Y2, Y3, and Y4 each having a long side extending in the first direction DR1. For example, in one or more embodiments, the horizontal loops X1, X2, and X3 may form a first loop group, and the vertical loops Y0, Y1, Y2, Y3, and Y4 may form a second loop group. For example, the first loop group may include horizontal loops X1, X2, and X3 each having a long side extending in the second direction DR2, and the second loop group may include vertical loops Y0, Y1, Y2, Y3, and Y4 each having a long side extending in the first direction DR1.

In one or more embodiments, each of the horizontal loops X1, X2, and X3 and the vertical loops Y0, Y1, Y2, Y3, and Y4 may include at least one closed loop. For example, in one or more embodiments, each of the horizontal loops X1, X2, and X3 and the vertical loops Y0, Y1, Y2, Y3, and Y4 may include two closed loops. However, embodiments of the present disclosure are not limited thereto, and number of closed loops included in each of the horizontal loops X1, X2, and X3 and the vertical loops Y0, Y1, Y2, Y3, and Y4 may be variously changed according to one or more embodiments.

For example, as the number of closed loops included in each of the horizontal loops X1, X2, X3 and the vertical loops Y0, Y1, Y2, Y3, and Y4 increases, sensing sensitivity of the digitizer 600 may improve.

The horizontal loops X1, X2, and X3 may include a first horizontal loop X1, a second horizontal loop X2, and a third horizontal loop X3. In addition, the vertical loops Y0, Y1, Y2, Y3, and Y4 may include a central vertical loop Y0, a first vertical loop Y1, a second vertical loop Y2, a third vertical loop Y3, and a fourth vertical loop Y4.

In one or more embodiments, as illustrated in FIG. 8, the horizontal loops X1, X2, and X3 may be arranged along the first direction DR1. For example, the second horizontal loop X2 may be arranged on one side of the first horizontal loop X1 in the first direction DR1. In addition, the third horizontal loop X3 may be arranged on one side of the second horizontal loop X2 in the first direction DR1.

In one or more embodiments, the horizontal loops X1, X2, and X3 may at least partially overlap each other in plan view. Here, that loops overlap each other in plan view may refer to that area surrounded by each of the loops overlaps each other in plan view. For example, in one or more embodiments, the first horizontal loop X1 and the second horizontal loop X2 may at least partially overlap in plan view, and the second horizontal loop X2 and the third horizontal loop X3 may at least partially overlap in plan view. For example, an area surrounded by the first horizontal loop X1 may at least partially overlap an area surrounded by the second horizontal loop X2 in plan view. In addition, the area surrounded by the second horizontal loop X2 may at least partially overlap an area surrounded by the third horizontal loop X3 in plan view.

The first horizontal loop X1 may be arranged adjacent to one end 600*a* of the digitizer 600. One end 600*a* of the digitizer 600 may extend in the second direction DR2. In one or more embodiments, the first horizontal loop X1 may include a first wire X1_1 and a second wire X1_2 each crossing the folding part 630. For example, each of the first wire X1_1 and the second wire X1_2 of the first horizontal loop X1 may extend in the second direction DR2. For example, a long side of the first horizontal loop X1 may extend in the second direction DR2. The first wire X1_1 of the first horizontal loop X1 may constitute a first loop of the first horizontal loop X1, and the second wire X1_2 of the first horizontal loop X1 may constitute a second loop of the first horizontal loop X1.

In one or more embodiments, the first loop of the first horizontal loop X1 and the second loop of the first horizontal loop X1 may at least partially overlap each other in plan view. For example, most of an area surrounded by the first ring of the first horizontal loop X1 and most of an area surrounded by the second ring of the first horizontal loop X1 may overlap each other in plan view. For example, in one or more embodiments, more than about 90% of the area surrounded by the first loop of the first horizontal loop X1 may overlap the area surrounded by the second loop of the first horizontal loop X1 in plan view, but embodiments of the present disclosure are not limited thereto.

The second horizontal loop X2 may include a first wire X2_1 and a second wire X2_2 each crossing the folding part 630. For example, each of the first wire X2_1 and the second wire X2_2 of the second horizontal loop X2 may extend in the second direction DR2. For example, a long side of the second horizontal loop X2 may extend in the second direction DR2. The first wire X2_1 of the second horizontal loop X2 may be arranged adjacent to one end 600*a* of the digitizer 600. The first wire X2_1 of the second horizontal loop X2 may constitute a first loop of the second horizontal loop X2, and the second wire X2_2 of the second horizontal loop X2 may constitute a second loop of the second horizontal loop X2.

In one or more embodiments, the first loop of the second horizontal loop X2 and the second loop of the second horizontal loop X2 may at least partially overlap each other in plan view. In one or more embodiments, an area in which the first loop of the second horizontal loop X2 and the second loop of the second horizontal loop X2 overlap each other in plan view may be smaller than an area in which the first loop of the first horizontal loop X1 and the second loop of the first horizontal loop X1 overlap each other in plan view. For example, in one or more embodiments, about 50% of the area surrounded by the first loop of the second horizontal loop X2 may overlap the area surrounded by the second loop of the second horizontal loop X2 in plan view, but embodiments of the present disclosure are not limited thereto.

The third horizontal loop X3 may include a first wire X3_1 and a second wire X3_2 each crossing the folding part 630. For example, each of the first wire X3_1 and the second wire X3_2 of the third horizontal loop X3 may extend in the second direction DR2. For example, a long side of the third horizontal loop X3 may extend in the second direction DR2. The first wire X3_1 of the third horizontal loop X3 may be arranged to be spaced and/or apart (e.g., spaced apart or separated) from one end 600*a* of the digitizer 600 in plan view. The first wire X3_1 of the third horizontal loop X3 may constitute a first loop of the third horizontal loop X3, and the second wire X3_2 of the third horizontal loop X3 may constitute a second loop of the third horizontal loop X3.

In one or more embodiments, the first loop of the third horizontal loop X3 and the second loop of the third horizontal loop X3 may at least partially overlap each other in plan view. In one or more embodiments, an area in which the first loop of the third horizontal loop X3 and the second loop of the third horizontal loop X3 overlap each other in plan view may be smaller than an area in which the first loop of the first horizontal loop X1 and the second loop of the first horizontal loop X1 overlap each other in plan view. For example, in one or more embodiments, about 50% of the area surrounded by the first loop of the third horizontal loop X3 may overlap the area surrounded by the second loop of the third horizontal loop X3 in plan view, but embodiments of the present disclosure are not limited thereto.

In one or more embodiments, as illustrated in FIGS. 9 and 10, the vertical loops Y0, Y1, Y2, Y3, and Y4 may be arranged along the second direction DR2. For example, in one or more embodiments, the central vertical loop Y0 may be arranged approximately at (e.g., around) a center of the folding part 630. For example, a central portion of the central vertical loop Y0 may be arranged near a central portion of the folding part 630. In addition, the first vertical loop Y1 may be arranged on one side of the central vertical loop Y0 in the second direction DR2. In addition, the second vertical loop Y2 may be arranged on another side of the central vertical loop Y0 in the second direction DR2. The third vertical loop Y3 may be arranged on one side of the first vertical loop Y1 in the second direction DR2 away from the central vertical loop Y0. In addition, the fourth vertical loop Y4 may be arranged on one side of the second vertical loop Y2 in the second direction DR2 away from the central vertical loop Y0. For example, the vertical loops Y0, Y1, Y2, Y3, and Y4 are arranged along the second direction DR2, and the central vertical loop Y0 is positioned at the center of the folding part 630. The first vertical loop Y1 is on one side of the central vertical loop Y0, and the second vertical loop Y2 is on the other side. The third vertical loop Y3 is on the other side of the first vertical loop Y1, away from the central vertical loop Y0. Similarly, the fourth vertical loop Y4 is on one side of the second vertical loop Y2, also away from the central vertical loop Y0.

In one or more embodiments, the vertical loops Y0, Y1, Y2, Y3, and Y4 may at least partially overlap each other in plan view. In the present context and unless defined otherwise, "plan view" refers to a view from above, looking down on the object. For example, the "object" here may refer to the vertical loops Y0, Y1, Y2, Y3, and Y4. When viewed from above (in plan view), these loops may at least partially overlap each other. For example, as described above, that loops overlap each other in plan view may refer to that area surrounded by each of the loops overlaps each other in plan view. For example, in one or more embodiments, the first vertical loop Y1 may at least partially overlap the central vertical loop Y0 in plan view. For example, an area surrounded by the first vertical loop Y1 may at least partially overlap an area surrounded by the central vertical loop Y0 in plan view. In addition, the second vertical loop Y2 may at least partially overlap the central vertical loop Y0 in plan view. For example, an area surrounded by the second vertical loop Y2 may at least partially overlap the area surrounded by the central vertical loop Y0 in plan view. In addition, the third vertical loop Y3 may at least partially overlap the first vertical loop Y1 in plan view. For example, an area surrounded by the third vertical loop Y3 may at least partially overlap the area surrounded by the first vertical loop Y1 in plan view. In addition, the fourth vertical loop Y4 may at least partially overlap the second vertical loop Y2 in plan view. For example, an area surrounded by the fourth vertical loop Y4 may at least partially overlap the area surrounded by the second vertical loop Y2 in plan view.

As described above, the central vertical loop Y0 may be arranged approximately at (e.g., around) the center of the folding part 630. The central vertical loop Y0 may include a first wire Y0_1 and a second wire Y0_2 each crossing the folding part 630. For example, each of the first wire Y0_1 and the second wire Y0_2 of the central vertical loop Y0 may extend in the second direction DR2. For example, a short side of the central vertical loop Y0 may extend in the second direction DR2. long sides of the central vertical loop Y0 may be arranged in the first non-folding part 610 and the second non-folding part 620. The first wire Y0_1 of the central vertical loop Y0 may constitute a first loop of the central vertical loop Y0, and the second wire Y0_2 of the central vertical loop Y0 may constitute a second loop of the central vertical loop Y0.

In one or more embodiments, the first loop of the central vertical loop Y0 and the second loop of the central vertical loop Y0 may at least partially overlap each other in plan view. For example, equal to or greater than about 50% and equal to or less than 90% of an area surrounded by the first loop of the central vertical loop Y0 may overlap an area surrounded by the second loop of the central vertical loop Y0 in plan view, but embodiments of the present disclosure are not limited thereto.

The first vertical loop Y1 may be arranged closer to the second non-folding part 620 from the folding part 630. The first vertical loop Y1 may include a first wire Y1_1 and a second wire Y1_2 each crossing at least a portion of the folding part 630. For example, each of the first wire Y1_1 and the second wire Y1_2 of the first vertical loop Y1 may extend in the first direction DR1. For example, a long side of the first vertical loop Y1 may extend in the first direction DR1. The long side of the first vertical loop Y1 may be arranged in the second non-folding part 620 and the folding part 630. A short side of the first vertical loop Y1 may cross the folding part 630 in the second direction DR2. The first wire Y1_1 of the first vertical loop Y1 may constitute a first loop of the first vertical loop Y1, and the second wire Y1_2 of the first vertical loop Y1 may constitute a second loop of the first vertical loop Y1.

In one or more embodiments, the first loop of the first vertical loop Y1 and the second loop of the first vertical loop Y1 may at least partially overlap each other in plan view. For example, in one or more embodiments, equal to or greater than about 50% and equal to or less than 90% of an area surrounded by the first loop of the first vertical loop Y1 may overlap an area surrounded by the second loop of the first vertical loop Y1 in plan view, but embodiments of the present disclosure are not limited thereto.

The second vertical loop Y2 may be arranged closer to the first non-folding part 610 from the folding part 630. The second vertical loop Y2 may include a first wire Y2_1 and a second wire Y2_2 each crossing at least a portion of the folding part 630. For example, each of the first wire Y2_1 and the second wire Y2_2 of the second vertical loop Y2 may extend in the first direction DR1. For example, a long side of the second vertical loop Y2 may extend in the first direction DR1. The long side of the second vertical loop Y2 may be arranged in the first non-folding part 610 and the folding part 630. A short side of the second vertical loop Y2 may cross the folding part 630 in the second direction DR2. The first wire Y2_1 of the second vertical loop Y2 may constitute a first loop of the second vertical loop Y2, and the second wire Y2_2 of the second vertical loop Y2 may constitute a second loop of the second vertical loop Y2.

In one or more embodiments, the first loop of the second vertical loop Y2 and the second loop of the second vertical loop Y2 may at least partially overlap each other in plan view. For example, in one or more embodiments, equal to or greater than about 50% and equal to or less than 90% of an area surrounded by the first loop of the second vertical loop Y2 may overlap an area surrounded by the second loop of the second vertical loop Y2 in plan view, but embodiments of the present disclosure are not limited thereto.

The third vertical loop Y3 may be arranged closer to the second non-folding part 620 from the folding part 630. The third vertical loop Y3 may include a first wire Y3_1 and a second wire Y3_2 each crossing at least a portion of the folding part 630. For example, each of the first wire Y3_1 and the second wire Y3_2 of the third vertical loop Y3 may extend in the first direction DR1. For example, a long side of the third vertical loop Y3 may extend in the first direction DR1. The long side of the third vertical loop Y3 may be arranged in the second non-folding part 620 and the folding part 630. A short side of the third vertical loop Y3 may cross the folding part 630 in the second direction DR2. The first wire Y3_1 of the third vertical loop Y3 may constitute a first loop of the third vertical loop Y3, and the second wire Y3_2 of the third vertical loop Y3 may constitute a second loop of the third vertical loop Y3.

In one or more embodiments, the first loop of the third vertical loop Y3 and the second loop of the third vertical loop Y3 may at least partially overlap each other in plan view. For example, in one or more embodiments, equal to or greater than about 50% and equal to or less than 90% of an area surrounded by the first loop of the third vertical loop Y3 may overlap an area surrounded by the second loop of the third vertical loop Y3 in plan view, but embodiments of the present disclosure are not limited thereto.

The fourth vertical loop Y4 may be arranged closer to the first non-folding part 610 from the folding part 630. The fourth vertical loop Y4 may include a first wire Y4_1 and a second wire Y4_2 each crossing at least a portion of the folding part 630. For example, each of the first wire Y4_1 and the second wire Y4_2 of the fourth vertical loop Y4 may extend in the first direction DR1. For example, a long side of the fourth vertical loop Y4 may extend in the first direction DR1. The long side of the fourth vertical loop Y4 may be arranged in the first non-folding part 610 and the folding part 630. A short side of the fourth vertical loop Y4 may cross the folding part 630 in the second direction DR2. The first wire Y4_1 of the fourth vertical loop Y4 may constitute a first loop of the fourth vertical loop Y4, and the second wire Y4_2 of the fourth vertical loop Y4 may constitute a second loop of the fourth vertical loop Y4.

In one or more embodiments, the first loop of the fourth vertical loop Y4 and the second loop of the fourth vertical loop Y4 may at least partially overlap each other in plan view. For example, in one or more embodiments, equal to or greater than about 50% and equal to or less than 90% of an area surrounded by the first loop of the fourth vertical loop Y4 may overlap an area surrounded by the second loop of the fourth vertical loop Y4 in plan view, but embodiments of the present disclosure are not limited thereto.

In one or more embodiments, each of the first horizontal loop X1, the second horizontal loop X2, the central vertical loop Y0, the first vertical loop Y1, the second vertical loop Y2, the third vertical loop Y3, and the fourth vertical loop Y4 may be arranged adjacent to one end 600*a* of the digitizer 600. For example, each of the first horizontal loop X1, the second horizontal loop X2, the central vertical loop Y0, the first vertical loop Y1, the second vertical loop Y2, the third vertical loop Y3, and the fourth vertical loop Y4 may include a portion arranged adjacent to one end 600*a* of the digitizer 600. For example, each of the first horizontal loop X1, the second horizontal loop X2, the central vertical loop Y0, the first vertical loop Y1, the second vertical loop Y2, the third vertical loop Y3, and the fourth vertical loop Y4 may include a wiring arranged adjacent to one end 600*a* of the digitizer 600.

For example, in the first non-folding part 610 and the second non-folding part 620, wirings arranged adjacent to one end 600*a* of the digitizer 600 may be densely arranged in the surrounding area (e.g., the surrounding area NAA of FIG. 6).

The plurality of holes HL may be arranged in the folding part 630. Wirings arranged in the folding part 630 may each cross the folding part 630 by bypassing the plurality of holes HL. As distance between the plurality of holes HL is smaller than widths of the surrounding areas of the first non-folding part 610 and the second non-folding part 620, it may not be easy to arrange wirings that cross the folding part 630 and are arranged adjacent to one end 600*a* of the digitizer 600, in such a way that wirings do not interfere with each other.

Figure 11:
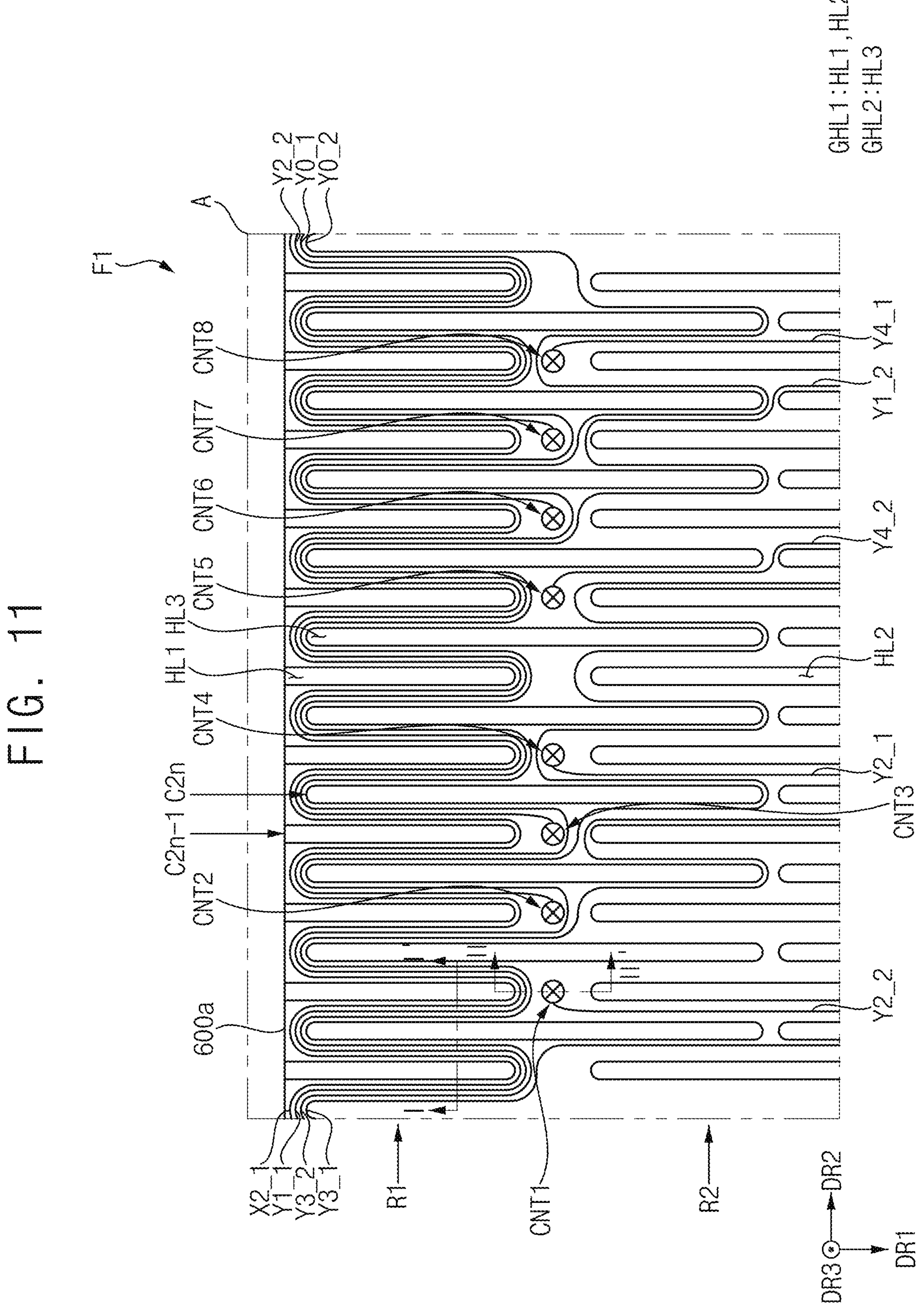
FIG. 11 is an enlarged plan view illustrating loops in a first wiring layer in area A of FIG. 6 according to one or more embodiments of the disclosure.

FIG. 11 is an enlarged plan view illustrating loops in a first wiring layer in area A of FIG. 6 according to one or more embodiments of the present disclosure. FIG. 12 is an enlarged plan view illustrating loops in a second wiring layer in area A of FIG. 6 according to one or more embodiments of the present disclosure.

Referring to FIGS. 8, 9, 10, 11, and 12, the plurality of holes HL may be arranged in the folding part 630. For example, the plurality of holes HL may be arranged in the folding area (for example, the folding area FDA of FIG. 1A). The plurality of holes HL may include a first group hole GHL1 arranged in an odd-th row C2*n*−1 and a second group hole GHL2 arranged in an even-th row C2*n*.

The odd-th row C2*n*−1 and the even-th row C2*n* may be alternately arranged along the second direction DR2. For example, the first group hole GHL1 and the second group hole GHL2 may be alternately arranged along the second direction DR2. For example, the second group hole GHL2 may be spaced and/or apart (e.g., spaced apart or separated) from the first group hole GHL1 in the second direction DR2 (or, a direction opposite to the second direction DR2).

In one or more embodiments, the first group hole GHL1 may include first holes HL1 and second holes HL2. The second holes HL2 may be spaced and/or apart (e.g., spaced apart or separated) from the first holes HL1 in the first direction DR1, respectively. For example, the first holes HL1 and the second holes HL2 may be arranged side by side in the first direction DR1, alternatively. For example, the second holes HL2 may be arranged on one side of the first holes HL1 in the first direction DR1. In one or more embodiments, the first holes HL1 may contact one end 600*a* of the digitizer 600.

The second group hole GHL2 may include third holes HL3. The third holes HL3 may be arranged to be spaced and/or apart (e.g., spaced apart or separated) from the first holes HL1 in the second direction DR2, respectively. In addition, the third holes HL3 may be arranged to be spaced and/or apart (e.g., spaced apart or separated) from the second holes HL2 in the second direction DR2, respectively. For example, the third holes HL3 may be arranged on one side of the first holes HL1 and the second holes HL2, respectively, in the second direction DR2. For example, the third holes HL3 may be arranged between adjacent first holes of the first holes HL1, respectively. In addition, the third holes HL3 may be arranged between adjacent second holes of the second holes HL2, respectively.

In one or more embodiments, the third holes HL3 may at least partially overlap the first holes HL1 in the second direction DR2. In addition, the third holes HL3 may at least partially overlap the second holes HL2 in the second direction DR2. In these embodiments, a first row R1 in which the first holes HL1 and the third holes HL3 overlap in the second direction DR2 may be defined. In addition, a second row R2 in which the second holes HL2 and the third holes HL3 overlap in the second direction DR2 may be defined. For example, the first row R1 in which the first holes HL1 and the third holes HL3 overlap in the second direction DR2 may be defined in the folding part 630. In addition, the second row R2 in which the second hole HL2 and the third holes HL3 overlap in the second direction DR2 may be defined in the folding part 630.

In one or more embodiments, a plurality of via holes may be arranged in the folding part 630. For example, the plurality of via holes may be arranged in the folding area. For example, a first via hole CNT1, a second via hole CNT2, a third via hole CNT3, a fourth via hole CNT4, a fifth via hole CNT5, a sixth via hole CNT6, a seventh via hole CNT7, and an eighth via hole CNT8 may be arranged in the folding part 630.

The plurality of via holes may be arranged between the first holes HL1 and the second holes HL2, respectively, in plan view. For example, the first via hole CNT1 may be arranged between a first hole of the first holes HL1 arranged in a third row and a second hole of the second holes HL2 arranged in a third row in plan view. In addition, the second via hole CNT2 may be arranged between a first hole of the first holes HL1 arranged in a fifth row and a second hole of the second holes HL2 arranged in a fifth row in plan view. In addition, the third via hole CNT3 may be arranged between a first hole of the first holes HL1 arranged in a seventh row and a second hole of the second holes HL2 arranged in a seventh row in plan view. In addition, the fourth via hole CNT4 may be arranged between a first hole of the first holes HL1 arranged in a ninth row and a second hole of the second holes HL2 arranged in a ninth row in plan view. In addition, the fifth via hole CNT5 may be arranged between a first hole of the first holes HL1 arranged in a thirteenth row and a second hole of the second holes HL2 arranged in a thirteenth row in plan view. In addition, the sixth via hole CNT6 may be arranged between a first hole of the first holes HL1 arranged in a fifteenth row and a second hole of the second holes HL2 arranged in a fifteenth row in plan view. In addition, the seventh via hole CNT7 may be arranged between a first hole of the first holes HL1 arranged in a seventeenth row and a second hole of the second holes HL2 arranged in a seventeenth row in plan view. In addition, the eighth via hole CNT8 may be arranged between a first hole of the first holes HL1 arranged in a nineteenth row and a second hole of the second holes HL2 arranged in a nineteenth row in plan view.

For example, the plurality of via holes may be arranged between the first row R1 and the second row R2, respectively, in plan view. FIGS. 11 and 12 may illustrate an embodiment in which eight via holes are arranged in the folding part 630, but this is an example number of via holes, and the number of via holes may be variously changed according to one or more embodiments. For example, in one or more embodiments, some of the plurality of via holes may not be provided, and a via hole may be arranged between a first hole of the first holes HL1 arranged in a eleventh row and a second hole of the second holes HL2 arranged in a eleventh row in plan view.

In one or more embodiments, the second via hole CNT2 may at least partially overlap the first via hole CNT1 in the second direction DR2. In addition, the third via hole CNT3 may at least partially overlap the second via hole CNT2 in the second direction DR2. In addition, the fourth via hole CNT4 may at least partially overlap the third via hole CNT3 in the second direction DR2. In addition, the fifth via hole CNT5 may at least partially overlap the fourth via hole CNT4 in the second direction DR2. In addition, the sixth via hole CNT6 may at least partially overlap the fifth via hole CNT5 in the second direction DR2. In addition, the seventh via hole CNT7 may at least partially overlap the sixth via hole CNT6 in the second direction DR2. In addition, the eighth via hole CNT8 may at least partially overlap the seventh via hole CNT7 in the second direction DR2.

In one or more embodiments, each of the plurality of via holes may have a circular shape in plan view. For example, each of the plurality of via holes may have a circular shape having a diameter of equal to or less than about 250 micrometers in plan view. However, embodiments of the present disclosure are not limited thereto, and each of the plurality of via holes may have one or more suitable shapes such as a polygonal shape and an elliptical shape in plan view.

In one or more embodiments, a second wiring layer F2 may be arranged on a first wiring layer F1. For example, in one or more embodiments, the second wiring layer F2 may be arranged on a first base layer (for example, a first base layer BSL1 of FIG. 13), and the first wiring layer F1 may be arranged below the first base layer.

In one or more embodiments, as illustrated in FIG. 11, the first wiring layer F1 may include the first wiring X2_1, the first wiring Y0_1, the second wiring Y0_2, the first wiring Y1_1, the second wiring Y1_2, the first wiring Y2_1, the second wiring Y2_2, the first wiring Y3_1, the second wiring Y3_2, the first wiring Y4_1, and the second wiring Y4_2. In addition, as illustrated in FIG. 12, the second wiring layer F2 may include the first wiring X1_1, the second wiring X1_2, the second wiring X2_2, the second wiring Y0_2, the second wiring Y1_2, the first wiring Y2_1, the second wiring Y2_2, the first wiring Y4_1, and the second wiring Y4_2. However, this is merely an example arrangement of wirings according to the example wiring layer (e.g., the first wiring layer F1 and the second wiring layer F2), and wirings constituting each of the first wiring layer F1 and the second wiring layer F2 may be variously changed according to one or more embodiments. For example, the first wiring X1_1 may be included in the first wiring layer F1.

Each of the first wiring X1_1 and the second wiring X1_2 may be arranged in the first row R1 in the folding part 630. For example, each of the first wiring X1_1 and the second wiring X1_2 may cross the folding part 630 in the second direction DR2 by bypassing the first holes HL1 and the third holes HL3 along the first row R1. In one or more embodiments, each of the first wiring X1_1 and the second wiring X1_2 may be a wiring included in the second wiring layer F2, but embodiments of the present disclosure are not limited thereto.

The first wiring X2_1 may be arranged in the first row R1 in the folding part 630, and the second wiring X2_2 may be arranged in the second row R2 in the folding part 630. For example, the first wiring X2_1 may cross the folding part 630 in the second direction DR2 by bypassing the first holes HL1 and the third holes HL3 along the first row R1. In addition, the second wiring X2_2 may cross the folding part 630 in the second direction DR2 by bypassing the second holes HL2 and the third HL3 along the second row R2. In one or more embodiments, the first wiring X2_1 may be a wiring included in the first wiring layer F1, and the second wiring X2_2 of may be included in the second wiring layer F2, but embodiments of the present disclosure are not limited thereto.

The first wiring Y0_1 may be arranged in at least a portion of the first row R1 in the first wiring layer F1. For example, the first wiring Y0_1 may cross at least a portion of the folding part 630 in the second direction DR2 by bypassing the first holes HL1 and the third holes HL3 along at least a portion of the first row R1. For example, the first wiring Y0_1 may bypass the first hole HL1 and the third holes HL3 along at least a portion of the first row R1 to reach the sixth via hole CNT6. The first wiring Y0_1 may extend from the first wiring layer F1 to the second wiring layer F2 through the sixth via hole CNT6. For example, the first wiring Y0_1 may extend from a lower part of a first base layer (e.g., a first base layer BSL1 of FIG. 14) to an upper part of the first base layer through the sixth via hole CNT6. For example, the first wiring Y0_1 may fill the sixth via hole CNT6. The first wiring Y0_1 extending from the first wiring layer F1 to the second wiring layer F2 through the sixth via hole CNT6 may cross the folding part 630 by bypassing the first holes HL1, the second holes HL2, and the third holes HL3 along at least a portion of the first row R1 and at least a portion of the second row R2. As a whole, the first wiring Y0_1 may cross the folding part 630 in the second direction DR2 along the first row R1 and the second row R2 in the first wiring layer F1 and the second wiring layer F2.

The second wiring Y0_2 may be arranged in at least a portion of the first row R1 and at least a portion of the second row R2 in the first wiring layer F1. For example, the second wiring Y0_2 may cross the folding part 630 in the second direction DR2 by bypassing the first holes HL1, the second holes HL2, and the third holes HL3 along at least a portion of the first row R1 and at least a portion of the second row R2. For example, the second wiring Y0_2 may bypass the first holes HL1, the second holes HL2, and the third holes HL3 along at least a portion of the first row R1 and at least a portion of the second row R2 to reach the third via hole CNT3. The second wiring Y0_2 may extend from the first wiring layer F1 to the second wiring layer F2 through the third via hole CNT3. For example, the second wiring Y0_2 may extend from a lower part of the first base layer to an upper part of the first base layer through the third via hole CNT3. For example, the second wiring Y0_2 may fill the third via hole CNT3. The second wiring Y0_2 extending from the first wiring layer F1 to the second wiring layer F2 through the third via hole CNT3 may cross the folding part 630 by bypassing the first holes HL1 and the third holes HL3 along at least a portion of the first row R1. As a whole, the second wiring Y0_2 may cross the folding part 630 in the second direction DR2 along the first row R1 and the second row R2 in the first wiring layer F1 and the second wiring layer F2.

The first wiring Y1_1 of may be arranged in at least a portion of the first row R1 and at least a portion of the second row R2 in the first wiring layer F1. For example, the first wiring Y1_1 may bypass the first holes HL1 and the third holes HL3 along at least a portion of the first row R1, bypass the second holes HL2 and the third holes HL3 along at least a portion of the second row R2, and extend in the first direction. As a whole, the first wiring Y1_1 may cross the folding part 630 in the second direction DR2 along the first row R1 and the second row R2 in the first wiring layer F1 and extend in the first direction DR1.

The second wiring Y1_2 may be arranged in at least a portion of the first row R1 in the second wiring layer F2. For example, the second wiring Y1_2 may cross the folding part 630 in the second direction DR2 by bypassing the first holes HL1 and the third holes HL3 along at least a portion of the first row R1. For example, the second wiring Y1_2 may bypass the first holes HL1 and the third holes HL3 along at least a portion of the first row R1 to reach the second via hole CNT2. The second wiring Y1_2 may extend from the second wiring layer F2 to the first wiring layer F1 through the second via hole CNT2. For example, the second wiring Y1_2 may extend from an upper part of the first base layer to a lower part of the first base layer through the second via hole CNT2. For example, the second wiring Y1_2 may fill the second via hole CNT2. The second wiring Y1_2 extending from the second wiring layer F2 to the first wiring layer F1 through the second via hole CNT2 may bypass the first holes HL1 and the third holes HL3 along at least a portion of the first row R1, bypass the second holes HL2 and the third holes HL3 along at least a portion of the second row R2, extend in the first direction DR1. As a whole, the second wiring Y1_2 may cross the folding part 630 along the first row R1 and the second row R2 in the first wiring layer F1 and the second wiring layer F2 and may extend in the first direction DR1.

The first wiring Y2_1 may be arranged in at least a portion of the first row R1 and at least a portion of the second row R2 in the second wiring layer F2. For example, the first wiring Y2_1 may bypass the first holes HL1 and the third holes HL3 along at least of a portion of the first row R1 and bypass the second holes HL2 and the third holes HL3 along at least of a portion of the second row R2 to reach the fourth via hole CNT4. The first wiring Y2_1 may extend from the second wiring layer F2 to the first wiring layer F1 through the fourth via hole CNT4. For example, the first wiring Y2_1 may extend from an upper part of the first base layer to a lower part of the first base layer through the fourth via hole CNT4. For example, the first wiring Y2_1 may fill the fourth via hole CNT4. The first wiring Y2_1 extending from the second wiring layer F2 to the first wiring layer F1 through the fourth via hole CNT4 may extend in the first direction DR1. As a whole, the first wiring Y2_1 may cross the folding part 630 in the second direction DR2 in the second wiring layer F2 and extend in the first direction DR1 in the first wiring layer F1.

The second wiring Y2_2 may be arranged in at least a portion of the first row R1 in the first wiring layer F1. For example, the second wiring Y2_2 may cross at least a portion of the folding part 630 in the second direction DR2 by bypassing the first holes HL1 and the third holes HL3 along at least a portion of the first row R1. For example, the second wiring Y2_2 may bypass the first holes HL1 and the third holes HL3 along at least a portion of the first row R1 to reach the seventh via hole CNT7. The second wiring Y2_2 may extend from the first wiring layer F1 to the second wiring layer F2 through the seventh via hole CNT7. For example, the second wiring Y2_2 may extend from a lower part of the first base layer to an upper part of the first base layer through the seventh via hole CNT7. For example, the second wiring Y2_2 may fill the seventh via hole CNT7. The second wiring Y2_2 extending from the first wiring layer F1 to the second wiring layer F2 through the seventh via hole CNT7 may cross at least a portion of the folding part 630 by bypassing the first holes HL1 and the third holes HL3 along at least a portion of the first row R1 and by bypassing the second holes HL2 and the third holes HL3 along at least a portion of the second row R2. In addition, the second wiring Y2_2 may bypass the second holes HL2 and the third holes HL3 along at least a portion of the second row R2 to reach the first via hole CNT1. The second wiring Y2_2 may extend from the second wiring layer F2 to the first wiring layer F1 through the first via hole CNT1. For example, the second wiring Y2_2 may extend from an upper part of the first base layer to a lower part of the first base layer through the first via hole CNT1. For example, the second wiring Y2_2 may fill the first via hole CNT1. The second wiring Y2_2 extending from the second wiring layer F2 to the first wiring layer F1 through the first via hole CNT1 may extend in the first direction DR1. As a whole, the second wiring Y2_2 may cross at least a portion of the folding part 630 along a first row R1 in the first wiring layer F1, cross at least a portion of the folding part 630 along the first row R1 and the second row R2 in the second wiring layer F2, and extend in the first direction DR1 in the first wiring layer F1.

The first wiring Y3_1 may bypass at least a portion of the first holes HL1 in the first wiring layer F1 and extend in the first direction DR1. For example, the first wiring Y3_1 may bypass a first hole of the first holes HL1 arranged in a first row and extend in the first direction DR1.

The second wiring Y3_2 may be arranged in at least a portion of the first row R1 and the second row R2 in the first wiring layer F1. For example, the second wiring Y3_2 may bypass the first holes HL1 and the third holes HL3 along at least a portion of the first row R1, and bypass the second holes HL2 and the third holes HL3 along at least a portion of the second row R2 and extend in the first direction DR1.

The first wiring Y4_1 may bypass at least a portion of the first holes HL1, at least a portion of the second holes HL2, and at least a portion of the third holes HL3 in the second wiring layer F2. For example, the first wiring Y4_1 may bypass a first hole of the first holes HL1 arranged in a twenty-first row, second holes of the second holes HL2 arranged in a nineteenth row and twenty-first row, and a third holes of the third holes HL3 arranged in a twentieth row to reach the eighth via hole CNT8. The first wiring Y4_1 may extend from the second wiring layer F2 to the first wiring layer F1 through the eighth via hole CNT8. For example, the first wiring Y4_1 may extend from an upper part of the first base layer to a lower part of the first base layer through the eighth via hole CNT8. For example, the first wiring Y4_1 may fill the eighth via hole CNT8. The first wiring Y4_1 extending from the second wiring layer F2 to the first wiring layer F1 through the eighth via hole CNT8 may extend in the first direction DR1.

The second wiring Y4_2 may be arranged in at least a portion of the first row R1 and at least a portion of the second row R2 in the second wiring layer F2. For example, the second wiring Y4_2 may bypass the first holes HL1 and the third holes HL3 along at least a portion of the first row R1 and bypass the second holes HL2 and the third holes HL3 along at least a portion of the second row R2 to reach the fifth via hole CNT5. The second wiring Y4_2 may extend from the second wiring layer F2 to the first wiring layer F1 through the fifth via hole CNT5. For example, the second wiring Y4_2 may extend from an upper part of the first base layer to a lower part of the first base layer through the fifth via hole CNT5. For example, the second wiring Y4_2 may fill the fifth via hole CNT5. The second wiring Y4_2 extending from the second wiring layer F2 to the first wiring layer F1 through the fifth via hole CNT5 may bypass the second holes HL2 and the third holes HL3 and extend in the first direction DR1. As a whole, the second wiring Y4_2 may cross at least a portion of the folding part 630 along the first row R1 and the second row R2 in the second wiring layer F2 and extend in the first direction DR1.

The detailed arrangement and shape of wirings illustrated in FIG. 11 and FIG. 12 are mere examples, and the detailed arrangement and shape of wirings may be variously changed according to one or more embodiments.

According to one or more embodiments, wirings arranged adjacent to one end 600*a* of the digitizer 600 and crossing at least a portion of the folding part 630 may be distributed and arranged in the first row R1 and the second row R2. For example, the first wiring X2_1 may be arranged in the first row R1, and the second wiring X2_2 may be arranged in the second row R2. In addition, the wirings arranged adjacent to one end 600*a* of the digitizer 600 and crossing at least a portion of the folding part 630 may be distributed and arranged in the first wiring layer F1 and the second wiring layer F2. For example, a portion of the wirings arranged adjacent to one end 600*a* of the digitizer 600 and crossing at least a portion of the folding part 630 may be arranged in the first wiring layer F1, and other portion of the wirings arranged adjacent to one end 600*a* of the digitizer 600 and crossing at least a portion of the folding part 630 may be arranged in the second wiring layer F2. For example, the first wiring Y3_1 may be arranged in the first wiring layer F1, and the second wiring X2_2 may be arranged in the second wiring layer F2. In addition, some of the wirings arranged adjacent to one end 600*a* of the digitizer 600 and crossing at least a portion of the folding part 630 may extend from the first wiring layer F1 to the second wiring layer F2 (or, from the second wiring layer F2 to the first wiring layer F1). For example, some of the wirings arranged adjacent to one end 600*a* of the digitizer 600 and crossing at least a portion of the folding part 630 may extend from a lower part of the first base layer to an upper part of the first base layer (or from an upper part of the first base layer to a lower part of the first base layer). For example, as described above, the first wiring Y0_1 may extend from the first wiring layer F1 to the second wiring layer F2 through the sixth via hole CNT6. For example, the first wiring Y0_1 may extend from a lower part of the first base layer to an upper part of the first base layer through the sixth via hole CNT6. Accordingly, interference between wirings is prevented or reduced and the digitizer 600 with improved reliability may be provided. For example, interference between the wirings arranged adjacent to one end 600*a* of the digitizer 600 may be prevented or reduced and the digitizer 600 with improved reliability may be provided. In addition, sensing uniformity may be improved over an entire area of the digitizer 600, and occurrence of an unrecognized area in the digitizer 600 may be prevented or reduced. For example, in one or more embodiments, wirings adjacent to one end 600*a* of the digitizer 600 and crossing at least a portion of the folding part 630 may be distributed in the first row R1 and the second row R2. For example, the first wiring X2_1 may be in the first row R1, and the second wiring X2_2 may be in the second row R2. Additionally, these wirings may be distributed in the first wiring layer F1 and the second wiring layer F2. For instance, some wirings may be in the first wiring layer F1, while others may be in the second wiring layer F2. For example, the first wiring Y3_1 may be in the first wiring layer F1, and the second wiring X2_2 may be in the second wiring layer F2. Some wirings may extend between the first and second wiring layers. For example, the first wiring Y0_1 may extend from the first wiring layer F1 to the second wiring layer F2 through the sixth via hole CNT6. This arrangement helps prevent or reduce interference between wirings, improving the reliability of the digitizer 600. Additionally, it enhances sensing uniformity across the entire area of the digitizer 600 and reduces the occurrence of unrecognized areas.

Figure 13:
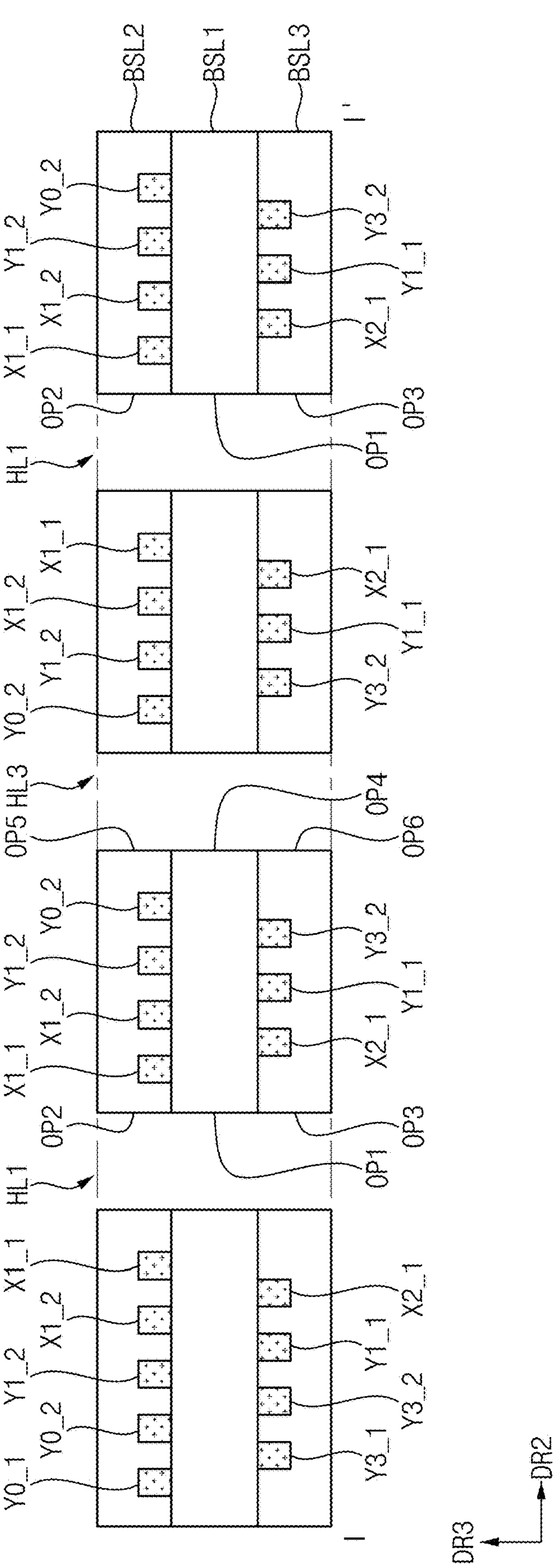
FIG. 13 is a cross-sectional view of the digitizer of FIG. 11 taken along the line I-I' according to one or more embodiments of the disclosure.
Figure 14:
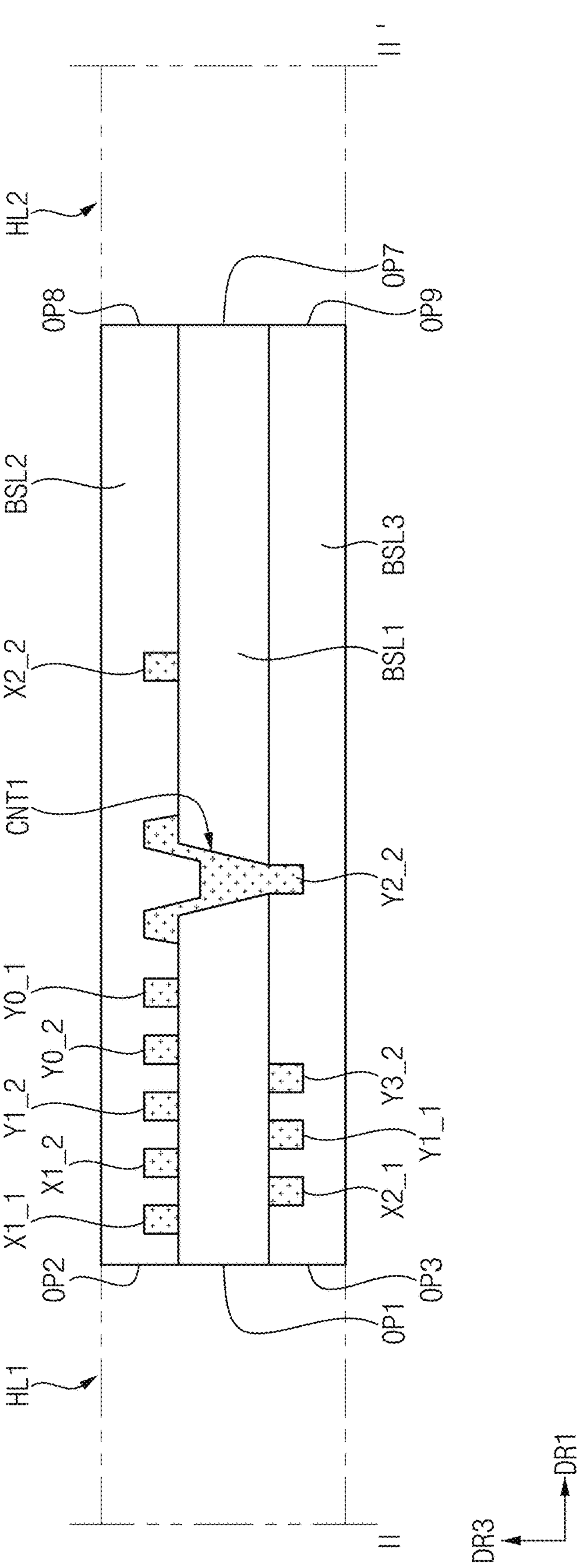
FIG. 14 is a cross-sectional view of the digitizer of FIG. 11 taken along the line II-II' according to one or more embodiments of the disclosure.

FIG. 13 is a cross-sectional view of the digitizer of FIG. 11 taken along the line I-I' according to one or more embodiments of the present disclosure. FIG. 14 is a cross-sectional view of the digitizer of FIG. 11 taken along the line II-II' according to one or more embodiments of the present disclosure.

Referring further to FIG. 13, at least some of the horizontal loops X1, X2, and X3 and at least some of the vertical loops Y0, Y1, Y2, Y3, and Y4 may be arranged on the first base layer BSL1. For example, the first wiring Y0_1, the second wiring Y0_2, the second wiring Y1_2, the second wiring X1_2, and the first wiring X1_1 may be arranged on the first base layer BSL1. In addition, the first wiring Y3_1, the second wiring Y3_2, the first wiring Y1_1, and the first wiring X2_1 may be arranged below the first base layer BSL1. Each of the horizontal loops X1, X2, and X3 and the vertical loops Y0, Y1, Y2, Y3, and Y4 may include a metal, an alloy, a metal nitride, a conductive metal oxide, a transparent conductive material, and/or the like. Non-limiting examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and/or the like. These materials may be used alone or in combination with each other. Non-limiting examples of the conductive metal oxide may include indium tin oxide, indium zinc oxide, and/or the like. These materials may be used alone or in combination with each other. Non-limiting examples of the metal nitride may include aluminum nitride ("$AlN_x$"), tungsten nitride ("$WN_x$"), chromium nitride ("$CrN_x$"), and/or the like. These materials may be used alone or in combination with each other.

A second base layer BSL2 may be arranged on the first base layer BSL1. The second base layer BSL2 may cover at least some of the horizontal loops X1, X2, and X3 and at least some of vertical loops Y0, Y1, Y2, Y3, and Y4. For example, the second base layer BSL2 may cover some of the horizontal loops X1, X2, and X3 and the vertical loops Y0, Y1, Y2, Y3, and Y4 arranged on the first base layer BSL1. For example, in one or more embodiments, the second base layer BSL2 may cover the first wiring Y0_1, the second wiring Y0_2, the second wiring Y1_2, the second wiring X1_2, and the first wiring X1_1.

The third base layer BSL3 may be arranged below the first base layer BSL1. The third base layer BSL3 may cover at least some of the horizontal loops X1, X2, and X3 and at least some of the vertical loops Y0, Y1, Y2, Y3, and Y4. For example, the third base layer BSL3 may cover some of the horizontal loops X1, X2, and X3 and the vertical loops Y0, Y1, Y2, Y3, and Y4 arranged below the first base layer BSL1. For example, in one or more embodiments, the third base layer BSL3 may cover the first wiring Y3_1, the second wiring Y3_2, the first wiring Y1_1, and the first wiring X2_1.

The first base layer BSL1 may define (or, include) a first opening OP1. For example, the first opening OP1 may penetrate (or, be defined through) the first base layer BSL1 in a thickness direction (e.g., the third direction DR3) of the first base layer BSL1. In addition, the second base layer BSL2 may define (or, include) a second opening OP2. For example, the second opening OP2 may penetrate (or, be defined through) the second base layer BSL2 in a thickness direction (e.g., the third direction DR3) of the second base layer BSL2. The third base layer BSL3 may define (or, include) a third opening OP3. For example, the third opening OP3 may penetrate (or, be defined through) the third base layer BSL3 in a thickness direction (e.g., the third direction DR3) of the third base layer BSL3.

In one or more embodiments, the first opening OP1, the second opening OP2, and the third opening OP3 may overlap each other in plan view. For example, the first opening OP1 may be spatially connected to each of the second opening OP2 and the third opening OP3. Accordingly, the first hole HL1 to which the first opening OP1, the second opening OP2, and the third opening OP3 are connected to each other may be defined.

In addition, the first base layer BSL1 may define (or, include) a fourth opening OP4. For example, the fourth opening OP4 may penetrate (or, be defined through) the first base layer BSL1 in a thickness direction (e.g., the third direction DR3) of the first base layer BSL1. In addition, the second base layer BSL2 may define (or, include) a fifth opening OP5. For example, the fifth opening OP5 may penetrate (or, be defined through) the second base layer BSL2 in a thickness direction (e.g., the third direction DR3) of the second base layer BSL2. The third base layer BSL3 may define (or, include) a sixth opening OP6. For example, the sixth opening OP6 may penetrate (or, be defined through) the third base layer BSL3 in a thickness direction (e.g., the third direction DR3) of the third base layer BSL3.

For example, each of the first holes HL1, the second holes HL2 (e.g., the second holes HL2 of FIG. 14), and the third holes HL3 may be understood as a configuration formed by overlapping an opening defined (or, included) in the first base layer BSL1, an opening defined (or, included) in the second base layer BSL2, and an opening defined (or, included) in the third base layer BSL3 in plan view. For example, the first holes HL1 may be understood as a configuration formed by overlapping the first opening OP1, the second opening OP2, and the third opening OP3 in plan view. In addition, the third holes HL3 may be understood as a configuration formed by overlapping the fourth opening OP4, the fifth opening OP5, and the sixth opening OP6 in plan view. As described above, the third holes HL3 may be arranged on one side of the first holes HL1 in the second direction DR2. This may be understood that the fourth opening OP4 is arranged on one side of the first opening OP1 in the second direction DR2, the fifth opening OP5 is arranged on one side of the second opening OP2 in the second direction DR2, and the sixth opening OP6 is arranged on one side of the third opening OP3 in the second direction DR2.

Referring further to FIG. 14, the second wiring X2_2 may be further arranged on the first base layer BSL1. The second base layer BSL2 may further cover the second wiring X2_2.

In addition, the first base layer BSL1 may define (or, include) a seventh opening OP7. For example, the seventh opening OP7 may penetrate (or, be defined through) the first base layer BSL1 in a thickness direction (e.g., the third direction DR3) of the first base layer BSL1. In addition, the second base layer BSL2 may define (or, include) an eighth opening OP8. For example, the eighth opening OP8 may penetrate (or, be defined through) the second base layer BSL2 in a thickness direction (e.g., the third direction DR3) of the second base layer BSL2. The third base layer BSL3 may define (or, include) a ninth opening OP9. For example, the ninth opening OP9 may penetrate (or, be defined through) the third base layer BSL3 in a thickness direction (e.g., the third direction DR3) of the third base layer BSL3.

The second holes HL2 may be understood as a configuration formed by overlapping the seventh opening OP7, the eighth opening OP8, and the ninth opening OP9 in plan view. As described above, the second holes HL2 may be arranged on one side of the first holes HL1 in the first direction DR1. It may be understood that the seventh opening OP7 is arranged on one side of the first opening OP1 in the first direction DR1, the eighth opening OP8 is arranged on one side of the second opening OP2 in the first direction DR1, and the ninth opening OP9 is arranged on one side of the third opening OP3 in the first direction DR1.

At least some of the vertical loops Y0, Y1, Y2, Y3, and Y4 may be arranged below the first base layer BSL1 and on the first base layer BSL1. For example, some of the vertical loops Y0, Y1, Y2, Y3, and Y4 may extend from a lower part of the first base layer BSL1 to an upper part of the first base layer BSL1 (or, from an upper part of the first base layer BSL1 to an lower part of the first base layer BSL1) through a via hole. For example, some of the vertical loops Y0, Y1, Y2, Y3, and Y4 may extend from the via hole in the third direction DR3. For example, the second wiring Y2_2 may be arranged below the first base layer BSL1 and on the first base layer BSL1. For example, the second wiring Y2_2 may extend from a lower part of the first base layer BSL1 to an upper part of the first base layer BSL1 (or from an upper part of the first base layer BSL1 to a lower part of the first base layer BSL1) through the first via hole CNT1. The first via hole CNT1 may penetrate (or, be defined through) the first base layer BSL1 in a thickness direction (e.g., the third direction DR3). As described above, the plurality of via holes may be respectively arranged between the first holes HL1 and the second holes HL2 in plan view. For example, the first via hole CNT1 may be arranged between a first hole of the first holes HL1 arranged in a third row and a second hole of the second holes HL2 arranged in a third row in plan view. For example, it may be understood that the first via hole CNT1 is arranged between the first opening OP1 and the seventh opening OP7 in plan view. FIG. 14 illustrates a cross-sectional structure of the first via hole CNT1, but cross-sectional structures of the second via hole CNT2, the third via hole CNT3, the fourth via hole CNT4, the fifth via hole CNT5, the sixth via hole CNT6, the seventh via hole CNT7, and the eighth via hole CNT8 may each be substantially the same as the cross-sectional structure of the first via hole CNT1.

In one or more embodiments, each of the first base layer BSL1, the second base layer BSL2, and the third base layer BSL3 may include a matrix and woven fiber lines arranged in the matrix. In one or more embodiments, the matrix may include a filler and an elastomer. For example, the matrix may include epoxy, polyester, polyamide, polycarbonates, polypropylene, polybutylene, vinyl ester, and/or the like. These materials may be used alone or in combination with each other. For example, the filler included in the matrix may include silica, barium sulfate, sintered talc, barium titanate, titanium oxide, clay, alumina, mica, boehmite, zinc borate, zinc stannate, and/or the like. These materials may be used alone or in combination with each other. For example, the elastomer included in the matrix may be a polymer material exhibiting rubber elasticity. For example, the elastomer may include a butadiene rubber, a styrene-butadiene rubber, an isoprene rubber, a styrene isoprene rubber, a polyester rubber, a polybutadiene, a hydrogenated polybutadiene, a nitrile-butadiene rubber, an acrylic rubber, a silicone rubber, and/or the like. These materials may be used alone or in combination with each other. In addition, the fiber lines may include a glass fiber reinforced plastic ("GFRP"). For example, each of the fiber lines may be provided in form of a bundle of multiple glass fibers.

As described above, the digitizer 600 may include a first wiring layer F1 and a second wiring layer F2. For example, the wirings arranged adjacent to one end 600*a* of the digitizer 600 and crossing at least a portion of the folding part 630 may be distributed and arranged in the first wiring layer F1 and the second wiring layer F2. Accordingly, a process of manufacturing the digitizer 600 may be simplified. For example, according to one or more embodiments, the process of the manufacturing the digitizer 600 including the first wiring layer F1 and the second wiring layer F2 may be more simplified than a manufacturing process of the digitizer including three or more wiring layers. Therefore, time, cost, and/or the like desired or required to manufacture the digitizer 600 may be reduced.

The digitizer of one or more embodiments of the present disclosure may be applied to one or more suitable display devices. For example, the digitizer of one or more embodiments of the present disclosure is applicable to one or more suitable display devices such as display devices for vehicles, ships, and aircraft, portable communication devices, display devices for exhibition or information transmission, medical display devices, and/or the like. For example, the digitizer of one or more embodiments of the present disclosure is applicable to an electronic apparatus that may include one or more selected from among televisions, monitors, large-size display devices such as outside billboards, personal computers, laptop computers, personal digital terminals, display devices for automobiles, game consoles, portable electronic devices, Internet of Things (IoT) devices, medium- and small-size display devices such as cameras, mobile phones, smartphones, tablet computers, mobile communication terminals, electronic notebooks, electronic books, portable multimedia players (PMPs), navigation devices, ultra-mobile personal computers (UMPCs), smartwatchs, watch phones, and/or head-mounted display devices (HMDs) for implementing virtual reality and/or augmented reality.

In the context of the present application and unless otherwise defined, the terms "use," "using," and "used" may be considered synonymous with the terms "utilize," "utilizing," and "utilized," respectively.

In the present disclosure, an expression that an element such as a layer, a region, a substrate, or a plate is placed "on" another element indicates not only embodiments in which the element is placed "directly on" the other element but also embodiments in which a further element may be interposed between the element and the other element. In contrast, if (e.g., when) an element is referred to as being "directly on" another element, there are no intervening element present therebetween. The terminology used herein is for the purpose of describing specific embodiments and is not intended to limit the disclosure. Throughout the disclosure, unless explicitly described to the contrary, the word "comprise/include/has" and variations such as "comprises/includes/have" or "comprising/including/having" will be understood to imply the inclusion of stated elements but not the exclusion of any other elements. "At least any one of A, B, and C," "at least any one of A, B, or C," "at least any one selected from among A, B, and C," and "at least any one selected from the group consisting of A, B, and C" may be construed as each of A, B, and C or a (e.g., any suitable) combination of two or more of A, B, and C (for example, ABC, ABB, BC, and CC). As used herein, "and/or" or "or" may include one or more combinations of corresponding components.

It will be understood that, although the terms "first," "second," "third," and so on may be used herein to describe one or more suitable elements, these elements are not limited by these terms. These terms are used to distinguish one element from another element. Thus, a first element described could also be termed as a second or third element without departing from the spirit and scope of the disclosure. As utilized herein, the singular forms "a," "an," "one," and "the" are intended to include the plural forms as well, unless the context clearly indicates otherwise. Further, the use of "may" when describing embodiments of the present disclosure refers to "one or more embodiments of the present disclosure.

Spatially relative terms, such as "beneath," "below," "lower," "above," "upper," and/or the like, may be used herein for descriptive purposes, and, thereby, to describe one element or feature's relationship to another element(s) or feature(s) as shown in the drawings. Spatially relative terms are intended to encompass different orientations of a device in use, operation, and/or manufacture in addition to the orientation depicted in the drawings. For example, if (e.g., when) the device in the drawings is turned upside down, elements described as "below" or "beneath" other elements or features would then be oriented "above" the other elements or features. Thus, in one or more embodiments, the example term "below" may encompass both (e.g., simultaneously) an orientation of above and below directions. Furthermore, the device may be otherwise oriented (e.g., rotated 90 degrees or at other orientations), and, as such, the spatially relative descriptors used herein interpreted accordingly.

As utilized herein, the terms "substantially," "about," or similar terms are used as terms of approximation and not as terms of degree, and are intended to account for the inherent deviations in measured or calculated values that would be recognized by those of ordinary skill in the art. "About" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this disclosure, including the claims, to expressly recite any sub-range subsumed within the ranges expressly recited herein.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

The digitizer, the display device, the electronic devices/apparatus, the digitizer/display device-manufacturing apparatus, or any other relevant apparatuses/devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

The foregoing is illustrative of example embodiments and is not to be construed as limiting thereof. Although a few embodiments have been described, those skilled in the art will readily appreciate that many modifications are possible in one or more embodiments without materially departing from the teachings and advantages of the present disclosure. Accordingly, all such modifications are intended to be included within the scope of the present disclosure as defined in the claims. Therefore, it is to be understood that the foregoing is illustrative of one or more suitable embodiments and is not to be construed as limited to the specific embodiments disclosed, and that modifications to the disclosed embodiments, as well as other embodiments, are intended to be included within the scope of the appended claims and equivalents thereof.

What is claimed is:

1. A digitizer, comprising:
- a first base layer comprising:
  - a first non-folding area;
  - a folding area contacting the first non-folding area; and
  - a second non-folding area contacting the folding area,
  - the first base layer defining:
  - a first opening in the folding area;
  - a second opening in the folding area and on one side of the first opening in a first direction; and
  - a first via hole between the first opening and the second opening in plan view;
- a first loop group comprising a plurality of loops having a long side extending in the first direction; and
- a second loop group comprising a plurality of loops having a long side extending in a second direction crossing the first direction,
- wherein at least some of the plurality of loops in the first loop group extend from a lower part of the first base layer to an upper part of the first base layer through the first via hole.

2. The digitizer of claim 1, wherein at least some of the plurality of loops in the first loop group fill the first via hole.

3. The digitizer of claim 1, wherein the first base layer defines a third opening in the folding area and on one side of the first opening and the second opening in the second direction.

4. The digitizer of claim 3, wherein a first row in which the first opening and the third opening overlap in the second direction and a second row in which the second opening and the third opening overlap in the second direction are defined in the folding area, and
- at least some of the plurality of loops in the first loop group cross the folding area along the first row and the second row.

5. The digitizer of claim 1, wherein the first opening contacts one end of the digitizer.

6. The digitizer of claim 1, wherein at least some of the plurality of loops in the first loop group are adjacent to one end of the digitizer.

7. The digitizer of claim 1, wherein the plurality of loops in the first loop group cross at least a portion of the folding area.

8. The digitizer of claim 1, further comprising:
- a second base layer on the first base layer and covering at least some of the plurality of loops in the first loop group and at least some of the plurality of loops in the second loop group.

9. The digitizer of claim 8, wherein the second base layer defines a fourth opening in the folding area and overlapping the first opening in plan view.

10. The digitizer of claim 9, further comprising:
- a third base layer under the first base layer and covering at least some of the plurality of loops in the first loop group and at least some of the plurality of loops in the second loop group.

11. The digitizer of claim 10, wherein the third base layer defines a fifth opening in the folding area and overlapping the first opening and the fourth opening in plan view.

12. The digitizer of claim 1, wherein the first base layer defines a second via hole at least partially overlapping the first via hole in the second direction.

13. The digitizer of claim 12, wherein at least some of the plurality of loops in the first loop group extend from a lower part of the first base layer to an upper part of the first base layer through the second via hole.

14. The digitizer of claim 1, wherein the first loop group comprises a first loop, and a long side of the first loop is in the first non-folding area and the second non-folding area.

15. The digitizer of claim 14, wherein the first loop group comprises a second loop, at least a portion of a long side of the second loop is in the first non-folding area, and at least a portion of a short side of the second loop is in the folding area.

16. The digitizer of claim 1, wherein at least some of the plurality of loops in the first loop group are below the first base layer and on the first base layer.

17. A display device, comprising:

a display panel; and a digitizer under the display panel, the digitizer comprising:

a first base layer comprising:

a first non-folding area;

a folding area contacting the first non-folding area; and a second non-folding area contacting the folding area, the first base layer defining:

a first opening in the folding area;

a second opening in the folding area and on one side of the first opening in a first direction; and a first via hole between the first opening and the second opening in plan view;

a first loop group comprising a plurality of loops having a long side extending in the first direction; and a second loop group comprising a plurality of loops having a long side extending in a second direction crossing the first direction, wherein at least some of the plurality of loops in the first loop group extend from a lower part of the first base layer to an upper part of the first base layer through the first via hole.

18. An electronic apparatus comprising a display device, the display device comprising:

a display panel; and a digitizer under the display panel, the digitizer comprising:

a first base layer comprising:

a first non-folding area;

a folding area contacting the first non-folding area; and a second non-folding area contacting the folding area, the first base layer defining:

a first opening in the folding area;

a second opening in the folding area and on one side of the first opening in a first direction; and a first via hole between the first opening and the second opening in plan view;

a first loop group comprising a plurality of loops having a long side extending in the first direction; and a second loop group comprising a plurality of loops having a long side extending in a second direction crossing the first direction, wherein at least some of the plurality of loops in the first loop group extend from a lower part of the first base layer to an upper part of the first base layer through the first via hole.

19. The electronic apparatus of claim 18, wherein the electronic apparatus comprises one or more selected from among televisions, monitors, outside billboards, personal computers, laptop computers, personal digital terminals, display devices for automobiles, game consoles, portable electronic devices, Internet of Things devices, cameras, mobile phones, smartphones, tablet computers, mobile communication terminals, electronic notebooks, electronic books, portable multimedia players, navigation devices, ultra-mobile personal computers, smartwatches, watch phones, and head-mounted display devices.

* * * * *